United States Patent [19]

Machida et al.

[11] Patent Number: 5,512,513
[45] Date of Patent: Apr. 30, 1996

[54] METHOD OF FABRICATING SEMICONDUCTOR DEVICE WITH WATER PROTECTIVE FILM

[75] Inventors: Katsuyuki Machida; Katsumi Murase; Nobuhiro Shimoyama; Toshiaki Tsuchiya; Junichi Takahashi; Kazushige Minegishi; Yasuo Takahashi; Hideo Namatsu; Kazuo Imai, all of Kanagawa, Japan

[73] Assignee: Nippon Telegraph and Telephone Corporation, Tokyo, Japan

[21] Appl. No.: 296,025

[22] Filed: Aug. 25, 1994

Related U.S. Application Data

[62] Division of Ser. No. 5,670, Jan. 19, 1993, Pat. No. 5,376,590.

[30] Foreign Application Priority Data

| Jan. 20, 1992 | [JP] | Japan | 4-027516 |
| Apr. 6, 1992 | [JP] | Japan | 4-113042 |
| Jun. 10, 1992 | [JP] | Japan | 4-150444 |
| Nov. 17, 1992 | [JP] | Japan | 4-329912 |
| Nov. 17, 1992 | [JP] | Japan | 4-329913 |
| Nov. 17, 1992 | [JP] | Japan | 4-329914 |

[51] Int. Cl.$^6$ ............................................. H01L 21/44
[52] U.S. Cl. ............................ 437/195; 437/231; 437/228
[58] Field of Search .......................... 437/195, 235, 437/238, 231, 247, 228 G; 148/DIG. 22

[56] References Cited

U.S. PATENT DOCUMENTS

| 4,885,262 | 12/1989 | Ting et al. | 437/231 |
| 5,003,062 | 3/1991 | Yen | 437/231 |
| 5,106,787 | 4/1992 | Yen | 437/231 |
| 5,204,288 | 4/1993 | Marks et al. | 437/228 |
| 5,312,512 | 5/1994 | Allman et al. | 156/636 |
| 5,364,818 | 11/1994 | Ouellet | 437/195 |
| 5,376,590 | 12/1994 | Machida et al. | 437/235 |
| 5,470,798 | 11/1995 | Ouellet | 437/231 |

Primary Examiner—George Fourson
Assistant Examiner—C. Everhart
Attorney, Agent, or Firm—Blakely, Sokoloff, Taylor & Zafman

[57] ABSTRACT

A semiconductor device includes an interlevel film constituted by a first dielectrics film containing dangling bonds and a bonded group of Si and hydrogen, and a second dielectrics film formed on the first dielectrics film.

15 Claims, 17 Drawing Sheets

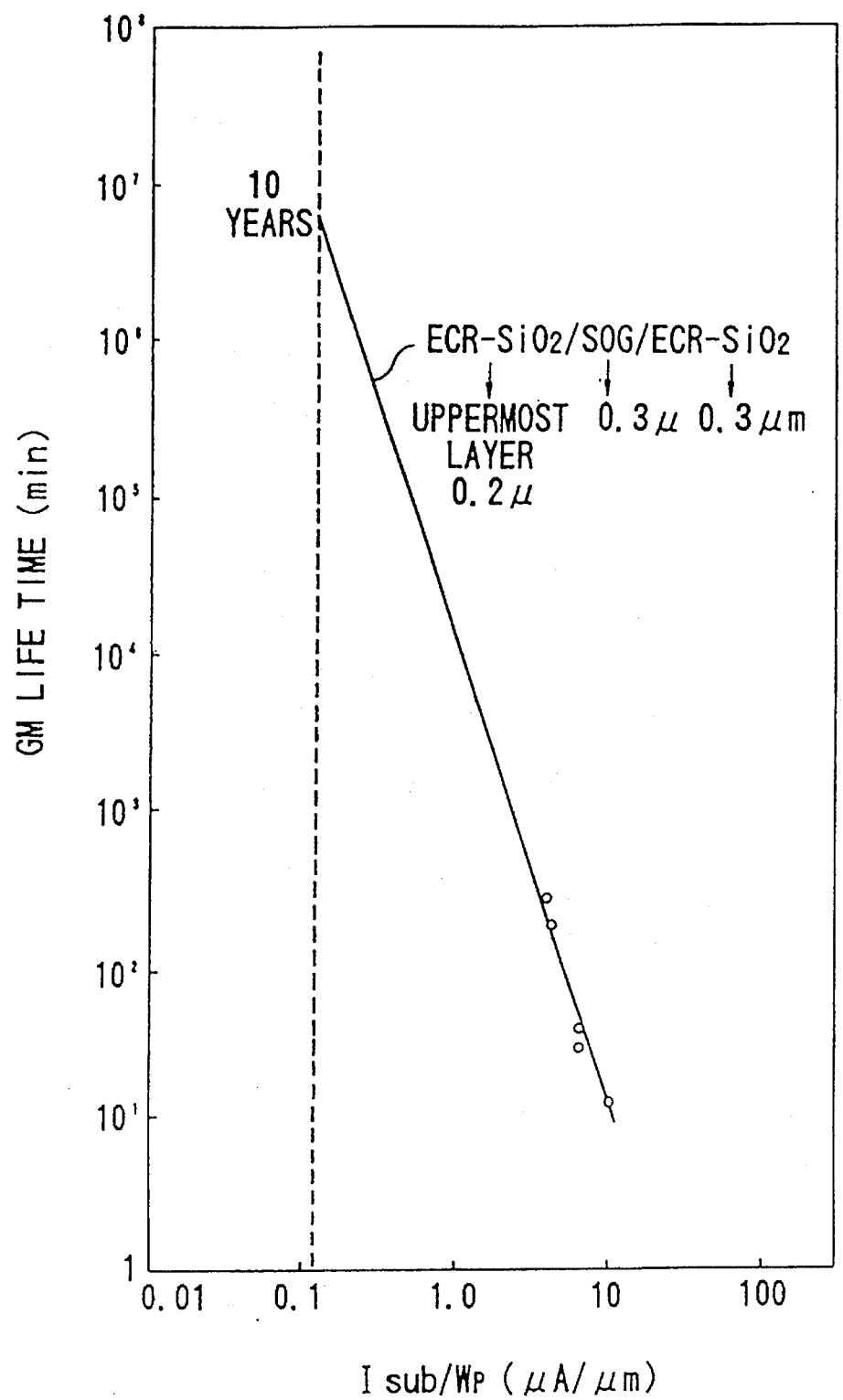
F I G. 7

METHOD OF FABRICATING SEMICONDUCTOR DEVICE WITH WATER PROTECTIVE FILM

This is a divisional of application Ser. No. 08/005,670, filed Jan. 19,1993, U.S. Pat. No. 5,376,590.

BACKGROUND OF THE INVENTION

The present invention relates to a semiconductor device and a method of fabricating the same and, more particularly, to a semiconductor device having a multilevel interconnection formed on a semiconductor device and a method of fabricating the same.

In a multilevel interconnection technology performed on a semiconductor device in order to increase the packing density of a semiconductor integrated circuit, planarization of an interlevel film is a very important factor, and a number of dielectrics film formation methods have been developed. A representative method is a sol coating method (spin on glass) by which planarization can be easily obtained. Also, ozone TEOS (tetraethoxysilane) CVD making use of a chemical reaction using TEOS and ozone as materials has been put into practical use recently.

It is, however, known that in these methods, a large amount of water is contained as a reaction product in a film.

On the other hand, as a drain electric field is increased due to miniaturization of MOSFETs, a hot-carrier tolerance has become a major problem in device reliability; carriers acquiring a high-energy state (becoming hot) in a high electric field are injected into a gate oxide film and trapped inside the oxide film or generate an interfacial level between the gate oxide film and a substrate, thereby degrading the device characteristics. It is known that if a large amount of an OH group is present in the gate oxide film, the degradation in device characteristics caused by hot-carrier injection is increased.

A dielectrics film formed by the spin on glass or the ozone TEOS (tetraethoxysilane) CVD (chemical vapor deposition) contains a large amount of water. If this water diffuses to a gate oxide film, an OH group is formed in the gate oxide film, and this may accelerate device degradation by hot carriers. Therefore, the use of a dielectrics film formed by these methods as a monolayer film is unpreferable in device reliability. Conventionally, as a method of forming these dielectrics films not directly on an interconnection, a method of forming dielectrics films by using glow discharge plasma CVD has also been developed. However, such a film is formed not for the purpose of preventing device degradation but as a protective film for preventing an interconnection degradation caused by the film formation temperature or impurities in the film. Actually, a first interlevel film was formed in this manner, and a first metal interconnection was formed on a MOS transistor device. Subsequently, a dielectrics film according to the plasma CVD as a second interlevel film, a film according to the ozone TEOS-CVD, and a dielectrics film according to the spin on glass were formed in this order to constitute a multilevel dielectrics film. After annealing was performed, film formation was again performed by the plasma CVD. In addition, holes are formed in this second interlevel dielectrics as connection holes with respect to a second metal interconnection, and the second metal interconnection and an interconnection pattern were formed. A plasma CVD film for surface protection was also formed. Lastly, annealing was performed in a hydrogen atmosphere at 400° C. FIG. 1 shows the degradation characteristics of a fine MOS transistor device formed through the above process.

FIG. 1 shows the substrate current (Isub) dependency per unit channel width of the reliability life time of the device. The substrate current (Isub) is directly proportional to the number of hot carriers generated; the larger the power supply applied to a device, the larger the substrate current. As shown in FIG. 1, there is a linear relationship, on a log-log plot, between the reliability life time and the substrate current (Isub) according to hot carriers. Hence, it is common practice to use the substrate current dependency of characteristics degradation in order to predict the reliability life time. It is predicted from FIG. 1 that the life time is about two months for a power supply of 3.3 V; in practice, the life time is required to be 10 years. This demonstrates that a device having such an interlevel film configuration cannot ensure a satisfactory reliability.

SUMMARY OF THE INVENTION

It is a principal object of the present invention to provide a highly reliable semiconductor device in which interlevel films independent of hot carriers are formed and planarization is achieved, and a method of fabricating the same.

In order to achieve the above object according to an aspect of the present invention, there is provided a semiconductor device comprising an interlevel film deposited by a first dielectrics film containing dangling bonds and a bonded group of Si and hydrogen, and a second dielectrics film formed on the first dielectrics film.

According to another aspect of the present invention, there is provided a method of fabricating a semiconductor device, comprising the steps of forming a first dielectrics film containing dangling bonds and a bonded group of Si and hydrogen, and forming a second dielectrics film on the first dielectrics film, thereby forming an interlevel film.

According to still another aspect of the present invention, there is provided a method of fabricating a semiconductor device, comprising the steps of forming a semiconductor device and a first metal interconnection on a semiconductor substrate, forming a first dielectrics film containing dangling bonds and a bonded group of Si and hydrogen, and forming a second dielectrics film on the first dielectrics film, thereby forming an interlevel film.

According to still another aspect of the present invention, there is provided a method of fabricating a semiconductor device, comprising the steps of forming a first dielectrics film capable of suppressing penetration of water on a semiconductor substrate, forming a second dielectrics film by spin on glass or chemical vapor deposition, heating the semiconductor substrate to desorb all or part of water from the second dielectrics film, and forming a third dielectrics film so as not to expose the surface to an atmosphere containing a large amount of water, thereby forming an interlevel film constituted by the dielectrics films.

According to still another aspect of the present invention, there is provided a method of fabricating a semiconductor device, comprising the steps of forming a semiconductor device and a first metal interconnection on a semiconductor substrate, forming a first dielectrics film capable of preventing penetration of water, forming a second dielectrics film on the first dielectrics film, forming a third dielectrics film having different characteristics from those of the second dielectrics film, forming holes reaching the first metal interconnection, and forming a second metal interconnection.

According to still another aspect of the present invention, there is provided a method of fabricating a semiconductor device, comprising the steps of forming a semiconductor device and a first metal interconnection on a semiconductor substrate, forming a first dielectrics film capable of suppressing penetration of water, forming a second dielectrics film on the first dielectrics film, forming a third dielectrics film having different characteristics from those of the second dielectrics film, forming a second metal interconnection on the third dielectrics film, and forming holes reaching the first metal interconnection, thereby connecting the first and second metal interconnections.

According to still another aspect of the present invention, there is provided a method of fabricating a semiconductor device, comprising the steps of forming a silicon oxide film containing at least one of oxides of boron and phosphorus on a semiconductor substrate on which a semiconductor device is formed, forming a first dielectrics film containing dangling bonds and a bonded group of Si and hydrogen, and forming a second dielectrics film on the first dielectrics film.

BRIEF DESCRIPTION OF THE DRAWINGS

FIG. 7 is a graph showing the degradation characteristics of the device shown in FIG. 6;

DESCRIPTION OF THE PREFERRED EMBODIMENTS

Embodiment 1

Figure 1:
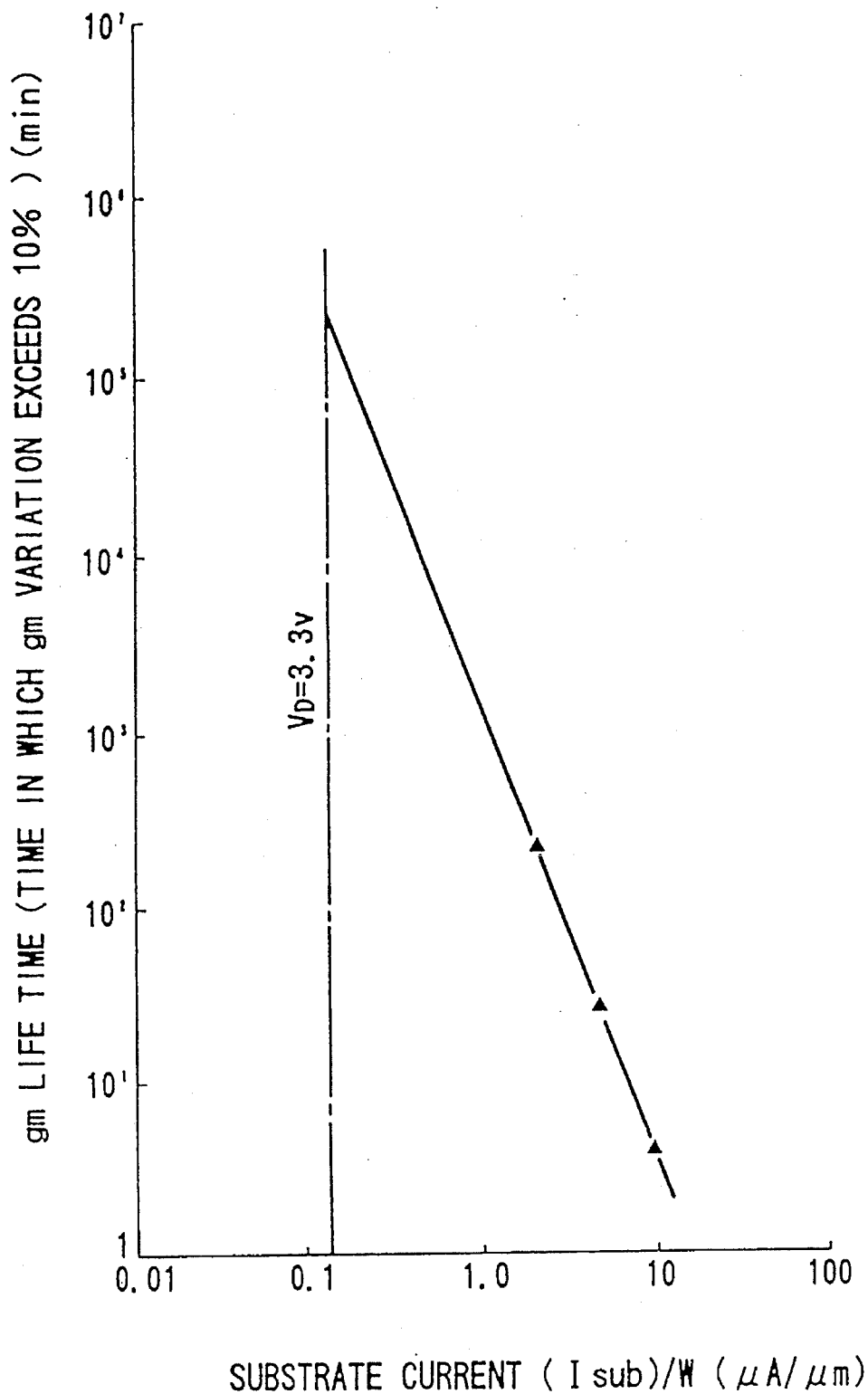
FIG. 1 is a graph showing the life time characteristics of substrate current-gm degradation indicating the reliability life time characteristics of a device.
Figure 2:
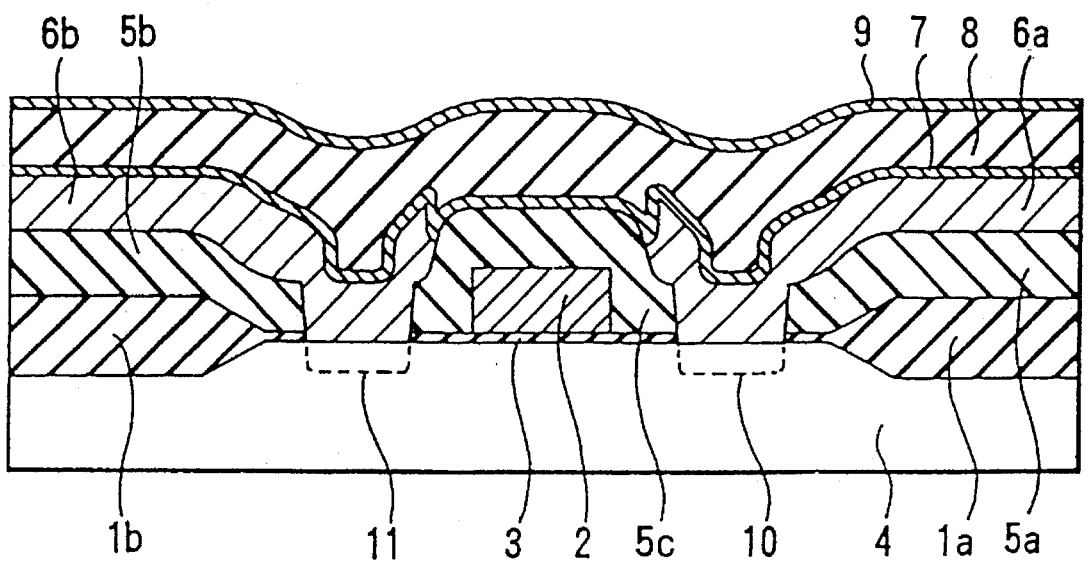
FIG. 2 is a sectional view showing the structure of one embodiment of a semiconductor device according to the present invention.

FIG. 2 shows one embodiment of a semiconductor device according to the present invention, particularly the section of a MOSFET. Referring to FIG. 2, reference numerals 1a and 1b denote oxide films for isolation; 2, a gate electrode; 3, a gate oxide film; 4, a silicon substrate; 5a, 5b, and 5c, first interlevel dielectrics; 6a and 6b, first metal interconnections; 7 and 9, first (lowermost) and third (uppermost) interlevel films of a second interlevel dielectrics; 8, a second (intermediate) interlevel film of the second interlevel dielectrics; and 10 and 11, source and drain regions formed in a semiconductor substrate. The gate electrode 2, the gate oxide film 3, the source region 10, and the drain region 11 constitute a MOS transistor semiconductor device. In this embodiment, 3,000-Å thick polysilicon was formed as the gate electrode 2, the gate oxide film 3 was formed to have a thickness of 100 to 200 Å by dry oxidation, and 5,000-Å thick AlSiCu was formed as the metal interconnections 6a and 6b. As the first and third interlevel films 7 and 9, $SiO_2$ films were formed to have thicknesses of 3,000 Å and 2,000 Å, respectively, by using ECR (Electron Cyclotron Resonance) plasma CVD (Chemical Vapor Deposition). As the second interlevel film 8, an ozone TEOS-$SiO_2$ film formed by atmospheric-pressure CVD taking advantage of decomposition of TEOS in the presence of ozone was used.

The ECR plasma CVD is a method of forming high-quality dielectrics films at low temperatures of 200° C. or less. The film formation conditions in this embodiment were a gas pressure of 1.0 mTorr of a gas mixture of $SiH_4$ and $O_3$ and a microwave power of 600 W. In this embodiment, no rf (radio frequency) power is applied in an ECR plasma CVD system. However, it is naturally possible to apply the rf power in order to further improve the film quality. In particular, the application of the rf power is essential to improve step-height side walls.

The film formation conditions for the ozone TEOS-$SiO_2$ film were a flow rate of 3 l/min. of nitrogen gas flowed through TEOS kept at 65° C., an ozone flow rate of 38 ml/min., and a substrate temperature of 400° C.

Figure 3:
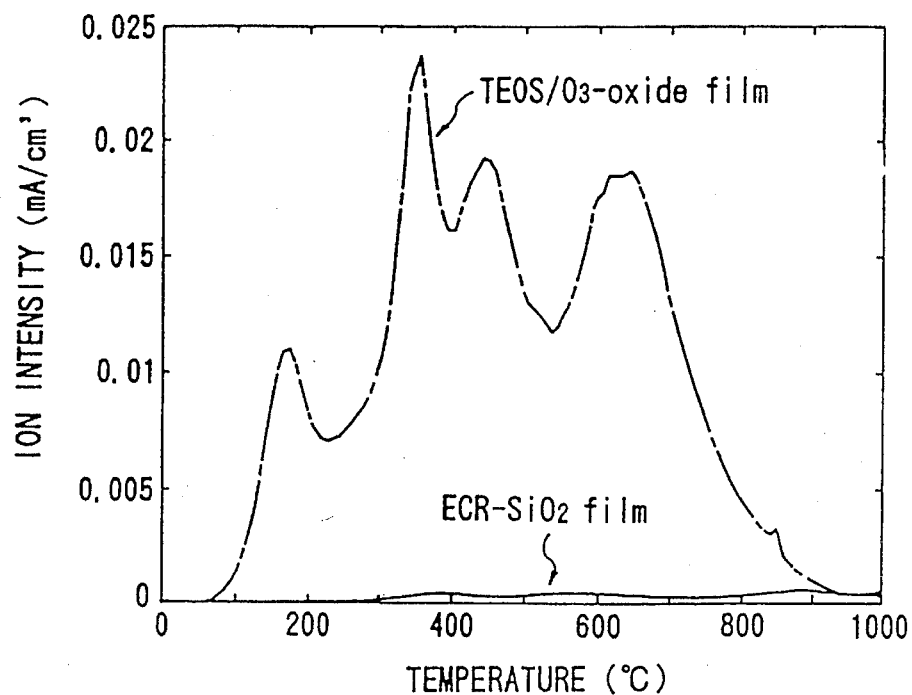
FIG. 3 is a graph showing the water content analysis results obtained by a TDS method for an $SiO_2$ film formed by ozone TEOS-$SiO_2$ film formed by ECR plasma CVD.

FIG. 3 shows the water content analysis results obtained by TDS (Thermal Desorption Spectroscopy) for the ozone TEOS-$SiO_2$ film and the $SiO_2$ film formed by the ECR plasma CVD. Referring to FIG. 3, the temperature is plotted on the abscissa, and the ion intensity is plotted on the ordinate. This graph reveals that the water content of the ozone TEOS-$SiO_2$ film is much larger than that of the ECR plasma CVD-$SiO_2$ film.

Figure 4:
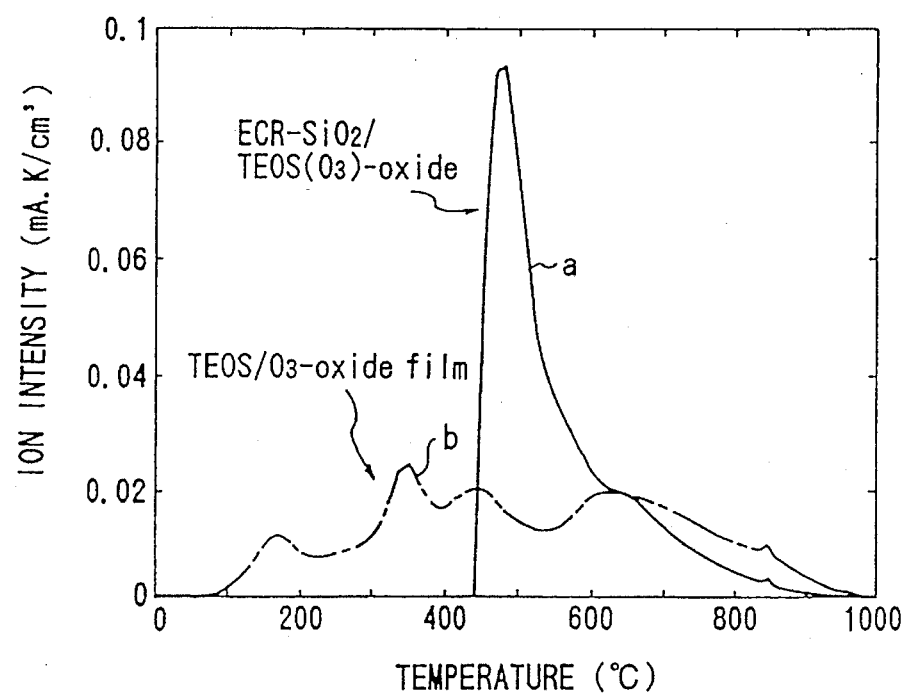
FIG. 4 is a graph showing the water content analysis results obtained by using the presence/absence of an ECR plasma CVD-$SiO_2$ film on an ozone TEOS-$SiO_2$ film as a parameter.

FIG. 4, on the other hand, depicts the water content analysis results obtained by using the presence/absence of the ECR plasma CVD-$SiO_2$ film on the ozone TEOS-$SiO_2$ film as a parameter. In FIG. 4, the temperature is plotted on the abscissa, and the ion intensity is plotted on the ordinate. As can be seen from FIG. 4, in characteristics curve a corresponding to the presence of the ECR plasma CVD-SiO$_2$ film, water appears from 440° C.; in characteristics curve b corresponding to the absence of the ECR plasma CVD-SiO$_2$ film, water appears from 70° C. From this comparison, it will be understood that the dielectrics film formed by the ECR plasma CVD has a blocking effect against water.

Figure 5:
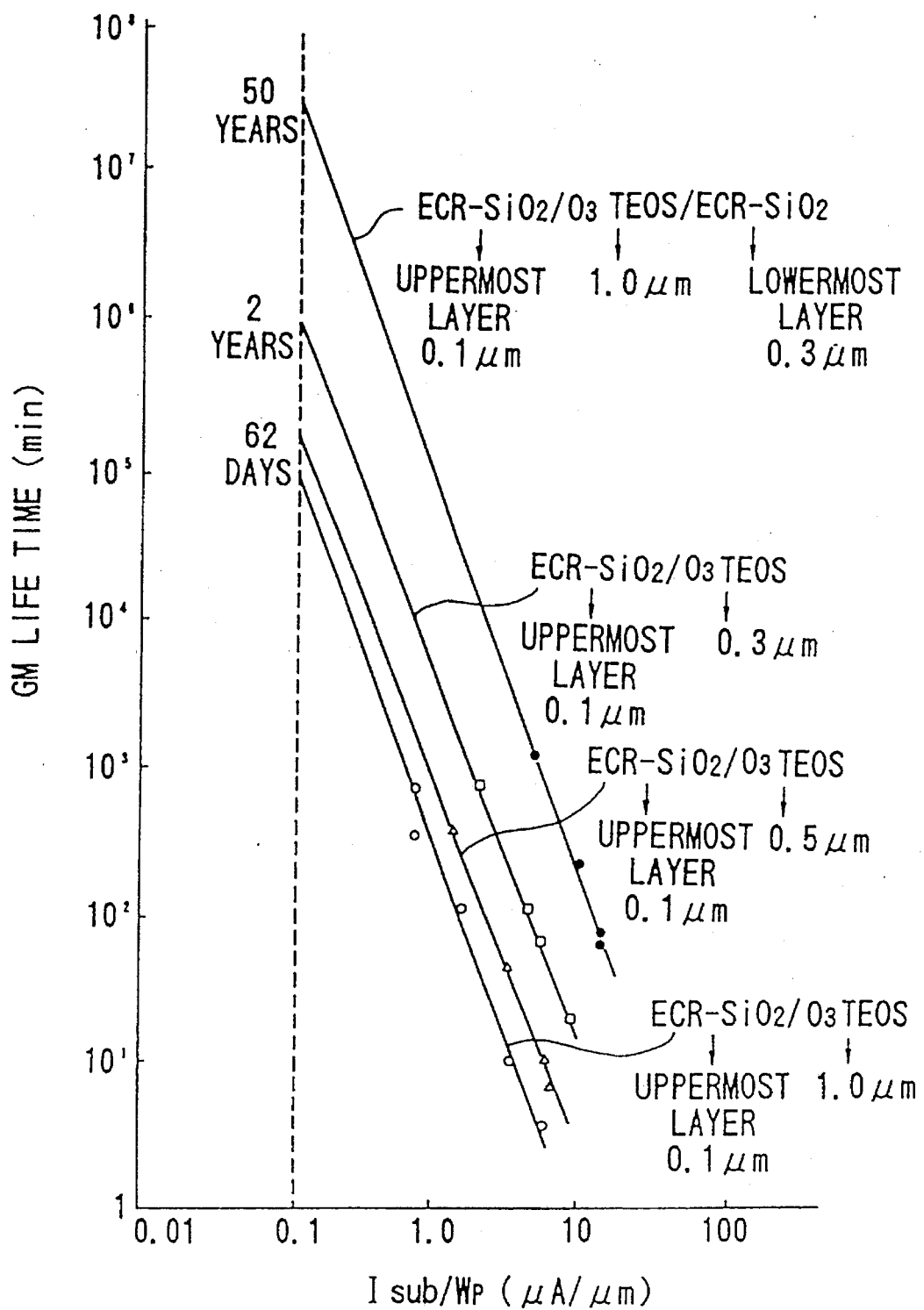
FIG. 5 is a graph showing the reliability life time characteristics of a device when the present invention is applied.

FIG. 5 is a graph showing the reliability life time characteristics of a device obtained when the present invention is applied. FIG. 5 demonstrates the film thickness dependence of an ozone TEOS-SiO$_2$ film and the results obtained when SiO$_2$ films were formed on and below the ozone TEOS-SiO$_2$ film by the ECR plasma CVD. In this graph, the substrate current (Isub) is plotted on the abscissa, and the gm life time is plotted on the ordinate. The graph of FIG. 5 shows that the life time of the device decreases with the increasing film thickness of the ozone TEOS-SiO$_2$ film. In particular, the life time was 62 days for a power supply of 3.3 V when the film thickness was 1.0 μm (indicated by symbols ○ in FIG. 5); the device cannot be put into practical use. However, the life time was remarkably improved (indicated by symbols ●) by forming the SiO$_2$ film below the 1.0-μm thick ozone TEOS-SiO$_2$ film by the ECR plasma CVD. The life time was improved because the SiO$_2$ film formed by the ECR plasma CVD blocked the penetration of water from the ozone TEOS-SiO$_2$ film to the device. The present invention, therefore, has a characteristic that it provides an interlevel dielectrics film configuration required for a multilevel interconnection and at the same time ensures a high reliability of a device.

Note that the SiO$_2$ film according to the ECR plasma CVD used in this embodiment can be a nitride film or an oxy-nitride-film, i.e., can be any film as long as the film can block water.

Figure 6:
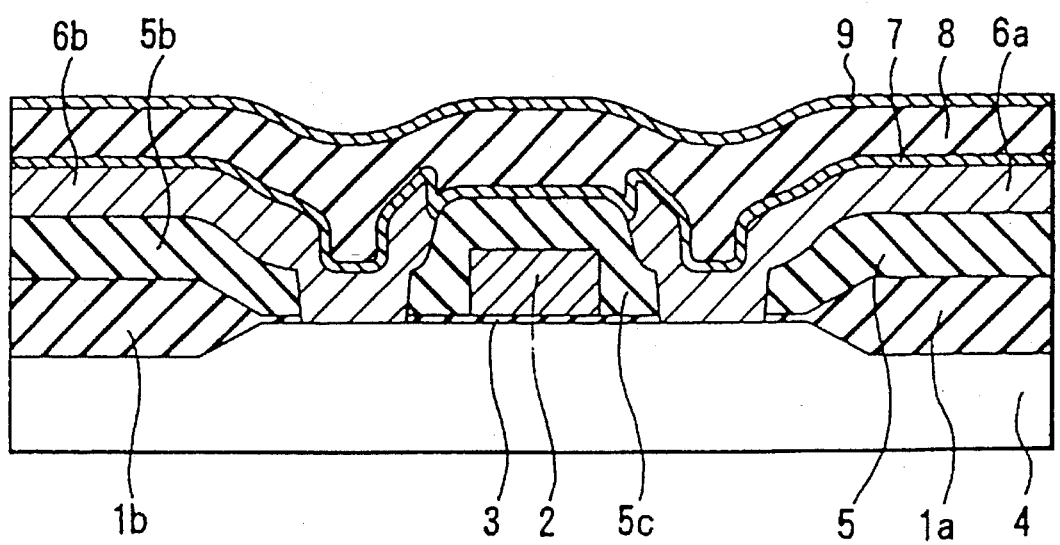
FIG. 6 is a sectional view showing the structure of a semiconductor device according to another embodiment of the present invention.

FIG. 6 shows the second embodiment of the present invention. FIG. 6 is identical with FIG. 2 except for a portion of the second interlevel film 8 shown in FIG. 2. A second interlevel film 8 shown in FIG. 6 is a dielectrics film formed by a coating method. In this embodiment, an SOG (Spin On Glass) film is used as the dielectrics film according to the coating method. FIG. 7 shows the reliability life time characteristics of a device according to this embodiment. Referring to FIG. 7, the substrate current (Isub) is plotted on the abscissa, and the gm life time is plotted on the ordinate.

FIG. 7 is a graph showing the degradation characteristics of a device obtained when a 3,000-Å thick SiO$_2$ film is formed on a device by the ECR plasma CVD, a 3,000-Å thick SOG film is formed on the SiO$_2$ film, and a 2,000-Å thick SiO$_2$ film is formed on the SOG film by the ECR plasma CVD. In this graph, the substrate current (Isub) is plotted on the abscissa, and the gm life time is plotted on the ordinate. FIG. 7 demonstrates that the life time of the device at a power supply of 3.3 V is about 10 year; the life time is of no problem. That is, in the present invention, a dielectrics film formed by the ECR plasma CVD has a blocking effect against water, and there can be provided an interlevel film formation method which assures a high reliability.

Embodiment 2

Figure 8:
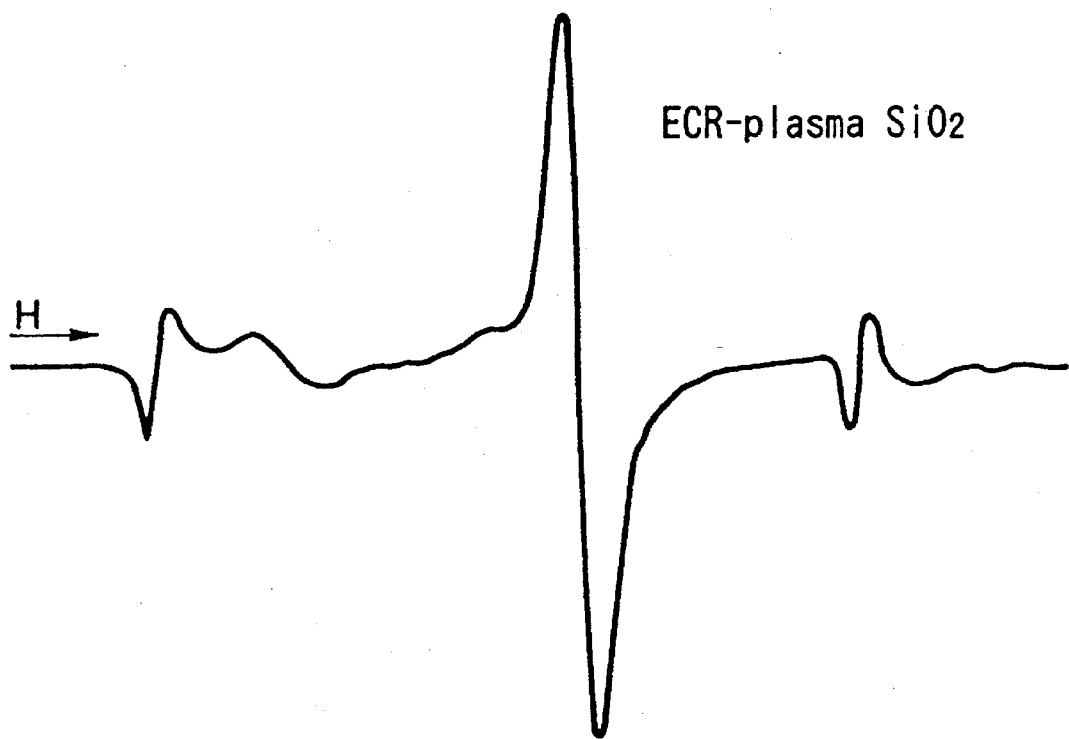
FIG. 8 is a graph showing the ESR spectrum of an ECR plasma CVD-$SiO_2$ film.

FIG. 8 shows an ESR (Electron Spin Resonance) spectrum of an ECR plasma CVD-SiO$_2$ film. From this spectrum analysis, it is determined that dangling bonds contained in the ECR plasma CVD-SiO$_2$ film are mainly Si atoms possessing unpaired electrons called E' centers. Table 1 shows the dependency of an unpaired electron density on deposition and annealing conditions measured by the ESR.

TABLE 1

| Conditions | Unpaired electron density (10$^{18}$ spins/cm$^3$) |
| --- | --- |
| Immediately after deposition | 19.0 |
| After deposition | |
| Nitrogen annealing at 400° C. for 30 min. | 1.5 |
| Hydrogen annealing at 400° C. for 30 min. | 0 |

Table 1 reveals that although the unpaired electron density can be decreased by annealing, it can be almost perfectly eliminated by a hydrogen treatment. The water preventing effects were compared among the three types of films listed in Table 1, i.e., the film containing a large number of unpaired electrons, the film in which the number of unpaired electrons was decreased by the nitrogen annealing, and the film in which unpaired electrons were eliminated by the hydrogen annealing. The device structure and the interlevel dielectrics film configuration used in this evaluation were those shown in FIG. 2. Each of the above three types of ECR plasma CVD-SiO$_2$ films was deposited as the lowermost layer to have a thickness of 0.3 μm, and a TEOS-O$_3$ film as an intermediate layer was deposited to have a thickness of 1.0 μm. Note that an ECR plasma CVD-SiO$_2$ film was used as the uppermost layer.

Figure 9:
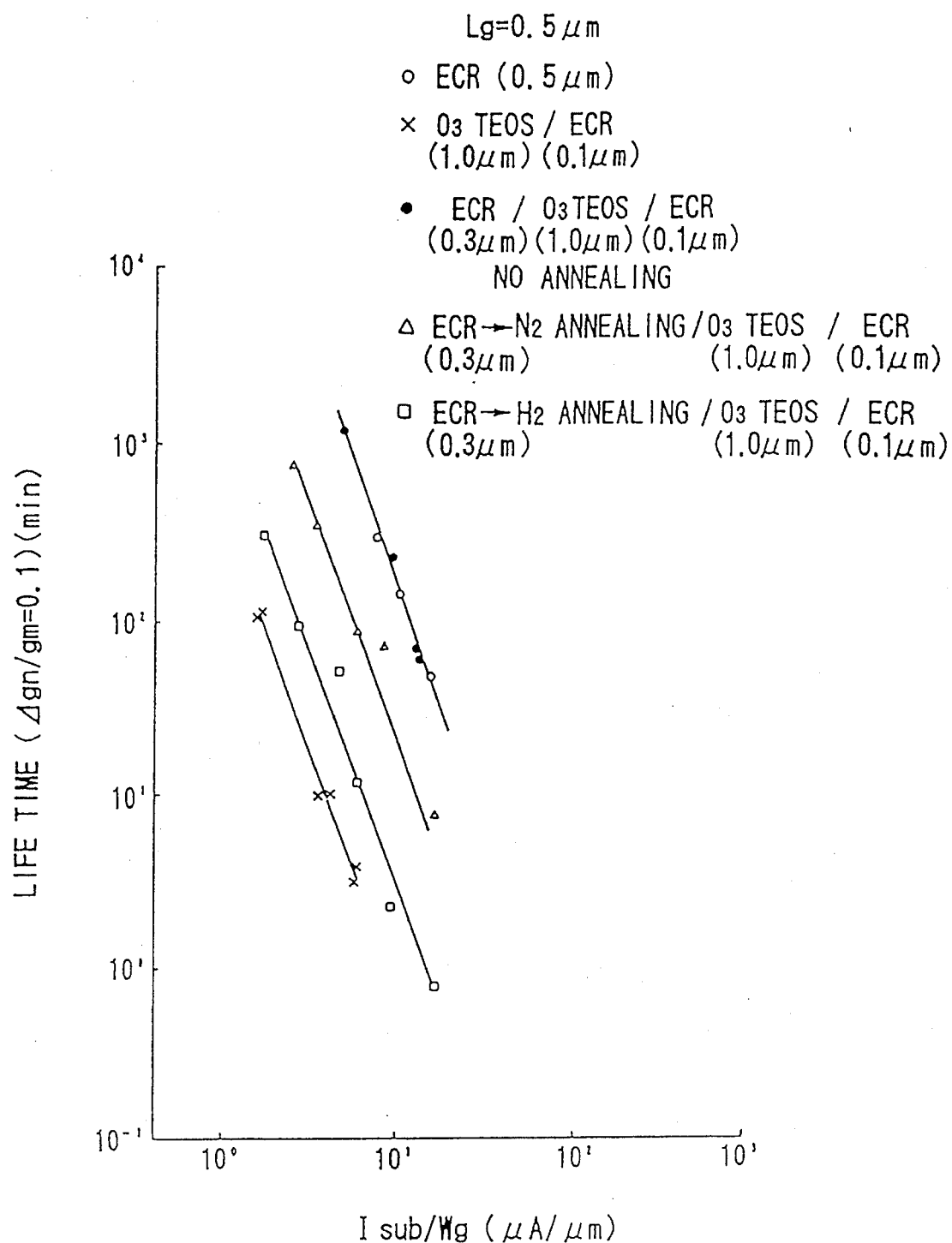
FIG. 9 is a graph showing the reliability life time characteristics of devices using films listed in Table 1.

FIG. 9 shows the reliability life time characteristics of the devices having these film configurations. In this graph, the substrate current (Isub) is plotted on the abscissa, and the gm life time is plotted on the ordinate. Referring to FIG. 9, symbols ●, Δ, and □ correspond to the ECR plasma CVD film, the film subjected to the nitrogen annealing, and the film subjected to the hydrogen annealing, respectively. For comparison, the characteristics obtained when no ECR plasma CVD-SiO$_2$ film was used as the lowermost layer for water prevention are indicated by symbols x, and the characteristics obtained when only the ECR plasma CVD-SiO$_2$ film was used without using any TEOS-O$_3$ film as a water generation source are also illustrated. As is apparent from FIG. 9, when no ECR plasma CVD-SiO$_2$ film for preventing water from the TEOS-O$_3$ film was used as the lowermost layer, the device life time was impractically short. However, the device life time was prolonged by the use of the water-preventing ECR plasma CVD-SiO$_2$ film, and this water-preventing effect was enhanced as the unpaired electron density in the film was increased. The reason for this can be considered that water in the film was trapped by unpaired electrons. In this case, the characteristics obtained are substantially the same as that when no TEOS-O$_3$ film as a water generation source was used, indicating that the ECR plasma CVD-SiO$_2$ film functioned almost perfectly as a water-preventing film.

Note that when the SiH$_4$/O$_2$ ratio of the material of the ECR plasma CVD-SiO$_2$ film is changed over the range of 0.5 to 0.8, there is a possibility that a film having an SiH$_4$/O$_2$ ratio of 0.5 or more can be used as a more effective water preventing film. The dangling bond and water preventing function of the ECR plasma CVD will be described below.

Figure 10:
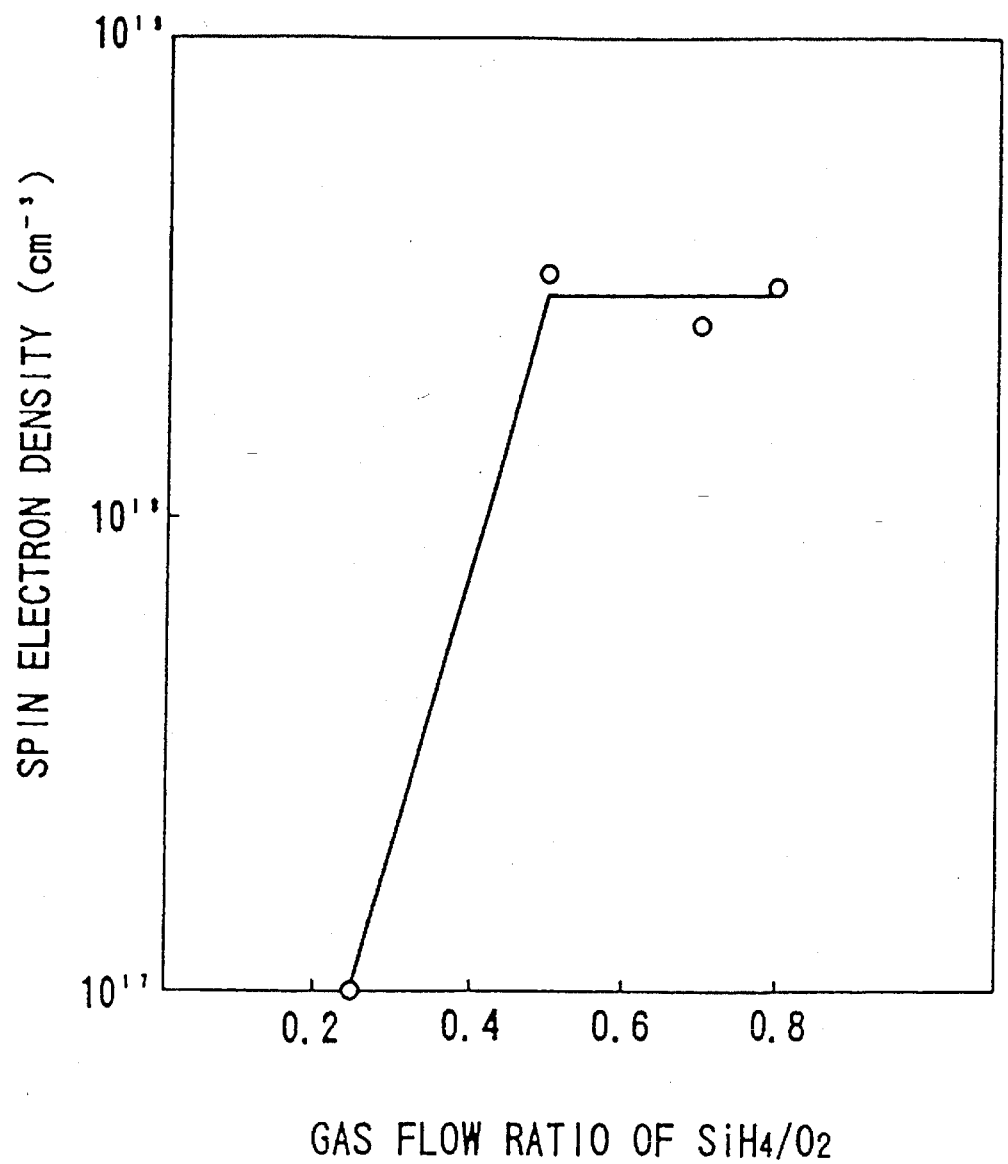
FIG. 10 is a graph showing an amount of dangling bonds in a dielectrics film formed by ECR plasma CVD.

FIG. 10 illustrates an amount of dangling bonds in a dielectrics film formed by the ECR plasma CVD, in which the gas flow ratio of SiH$_4$ to oxygen is plotted on the abscissa and the spin electron density, i.e., the dangling bond density obtained by ESR measurement is plotted on the ordinate. As can be seen from FIG. 10, the dangling bond density derived from the ECR plasma CVD was $10^{18}$ cm$^{-3}$ or more at a flow ratio of 0.5 or more. When the flow rate of SiH$_4$ was decreased to reduce the gas flow ratio, the spin electron density was smaller than the measurement limit. That is, dangling bonds are decreased in number when the gas flow ratio is reduced.

Embodiment 3

In this embodiment, an ozone TEOS-SiO$_2$ film was formed as an intermediate dielectrics film 8 of a second interlevel film by atmospheric-pressure CVD using decomposition of TEOS in the presence of ozone, and an SOG film was formed by spin on glass. An SiO$_2$ film having 2,000 Å in thickness was formed as an uppermost dielectrics film 9 of the second interlevel film by plasma CVD. The film formation conditions in this embodiment were a gas pressure of 1.0 mTorr of a gas mixture of SiH$_4$ and O$_2$ and a microwave power of 600 W. After the SOG formation by the spin on glass, curing was performed at 400° C. The ozone TEOS-SiO$_2$ film and the SOG have high water absorption rates and therefore contain large amounts of water.

Figure 11:
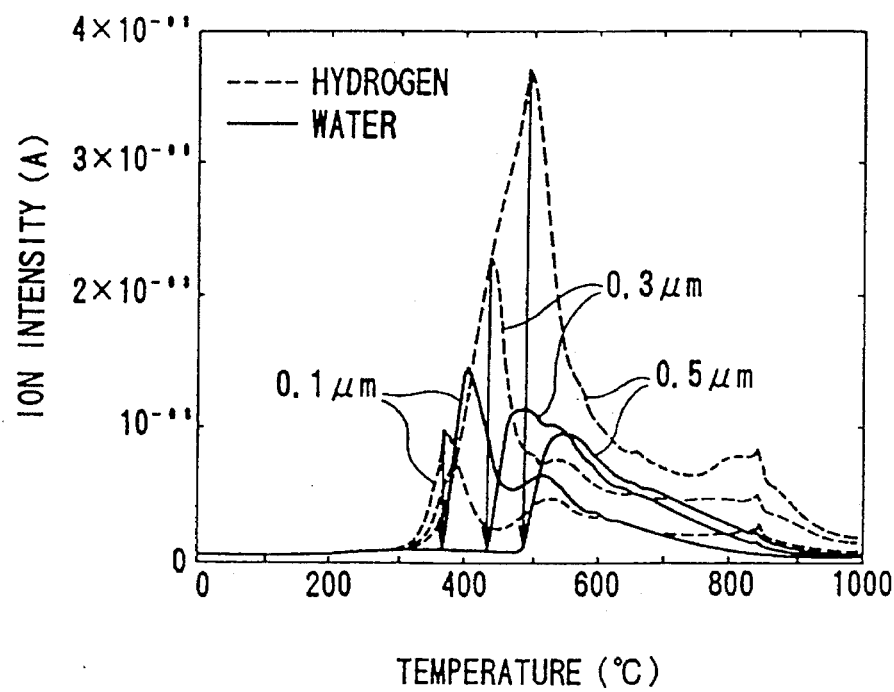
FIG. 11 is a graph showing the hydrogen and water content analysis results obtained by TDS (Thermal Desorption Spectroscopy) when $SiO_2$ films having different film thicknesses are formed on SOG films by the ECR plasma CVD.

FIG. 11 shows the hydrogen and water content analysis results obtained by TDS (Thermal Desorption Spectroscopy) for structures in which SiO$_2$ films having different film thicknesses are formed on SOG films by ECR plasma CVD. In this graph, the temperature is plotted on the abscissa, and the ion intensity is plotted on the ordinate. In the ECR plasma CVD, the gas flow ratio of SiH$_4$ to oxygen was 0.5. It is apparent from FIG. 11 that the emission amount of hydrogen increased as the film thickness increased and emission of water started after the emission peak of hydrogen.

Figure 12:
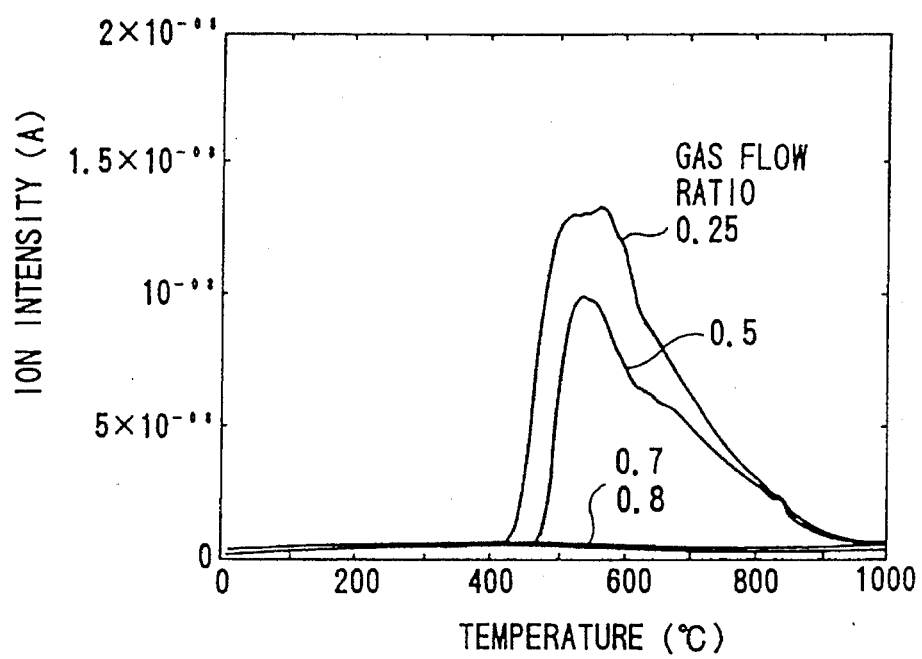
FIG. 12 is a graph showing the water content analysis results obtained by the TDS when an ECR plasma CVD film is formed on SOG and the gas flow ratio of $SiH_4$ to oxygen is changed.

FIG. 12 shows the water content analysis result obtained by the TDS for an SiO$_2$ film formed on SOG by the ECR plasma CVD while the gas flow ratio of SiH$_4$ to oxygen is changed. In this graph, the temperature is plotted on the abscissa, and the ion intensity is plotted on the ordinate. As can be seen from FIG. 12, the water-preventing effect was improved as the gas flow ratio was increased from 0.25 to 0.5, 0.7, and 0.8.

Figure 13:
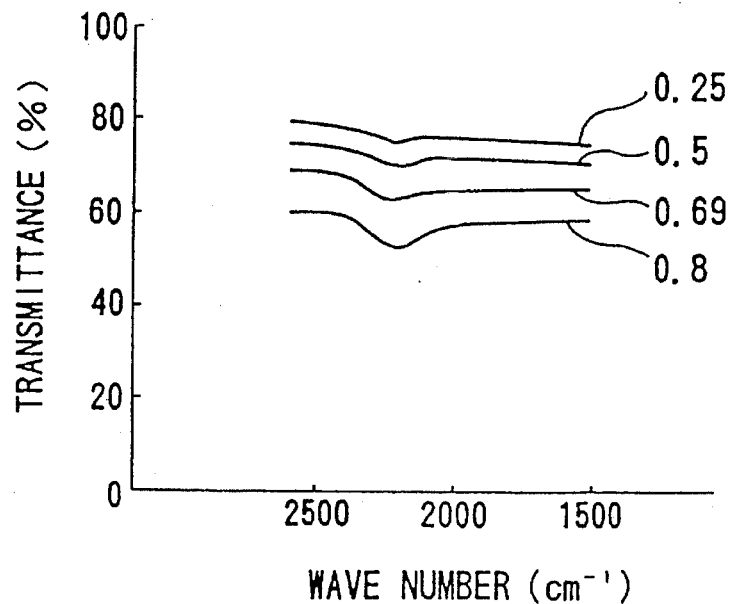
FIG. 13 is a graph showing the Si-H peak of the infrared absorption characteristics of an ECR plasma CVD dielectrics film when a gas flow ratio is changed.

FIG. 13 illustrates the Si-H peak of the infrared absorption characteristics of a dielectrics film formed by the ECR plasma CVD while the gas flow ratio is changed. In this graph, the wave number is plotted on the abscissa, and the transmittance is plotted on the ordinate. FIG. 13 reveals that Si-H bonds are increased with the increasing gas flow ratio. Since the amount of dangling bonds in a film remains unchanged even when the gas flow ratio is changed as demonstrated in FIG. 10, there is a possibility that bonded groups of Si and hydrogen in the film are associated with production of dangling bonds. That is, it can be considered that not only dangling bonds but also Si-H bonded groups contribute to the blocking effect against water of a dielectrics film formed by the ECR plasma CVD. The characteristic of the present invention is to improve the water blocking by increasing the SiH$_4$ gas flow rate even in the ECR plasma CVD. It is, however, apparent from the above examination that this effect can also be obtained by increasing Si-H bonds in an SiO$_2$ film by the use of Si$_2$H$_6$ gas or by using a nitride film or an oxy-nitride-film having Si-H bonds.

The formation of the uppermost dielectrics film 9 of the second interlevel film shown in FIG. 2 will be described. In the present invention, an SiO$_2$ film having 2,000 Å in thickness was formed as the dielectrics film 9 by using the plasma CVD for the reason explained below. That is, when dielectrics films are to be formed by the plasma CVD, since a wafer is heated up to 400° C. in a wafer holder of a plasma CVD system, water can be desorbed from an intermediate dielectrics film of the second interlevel film during a pretreatment of the film formation or during the film formation. In addition, the intermediate dielectrics film of the second interlevel film can be covered with the uppermost dielectrics film, so an interlevel film with little water content as a whole is realized.

Figure 14:
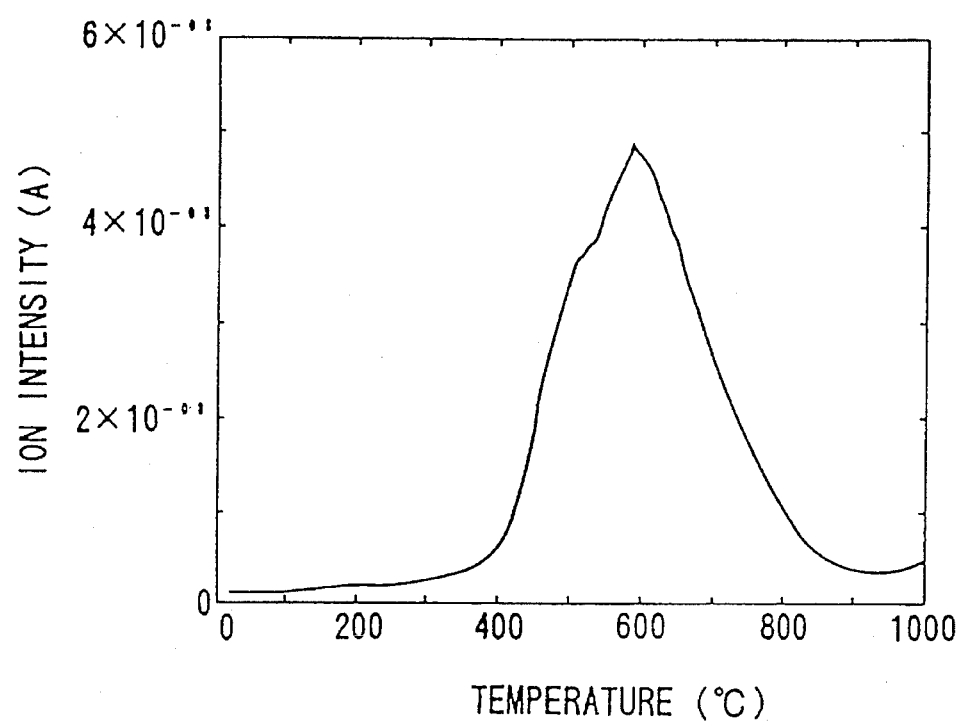
FIG. 14 is a graph showing the water content desorption analysis result obtained by the TDS for an $SiO_2$ film formed on SOG by the plasma CVD.

FIG. 14 shows the water desorption analysis result obtained by the TDS for an SiO$_2$ film formed on SOG by the plasma CVD. In this graph, the temperature is plotted on the abscissa, and the ion intensity is plotted on the ordinate. It can be considered that since substrate heating at 400° C. was performed in the plasma CVD, water in SOG disappeared during the heating up to 400° C., and no desorption peak appeared; this proves the above assumption. Although the plasma CVD is adopted in the present invention, any thin film formation system having a substrate heating mechanism can be used to realize this effect.

Figure 15:
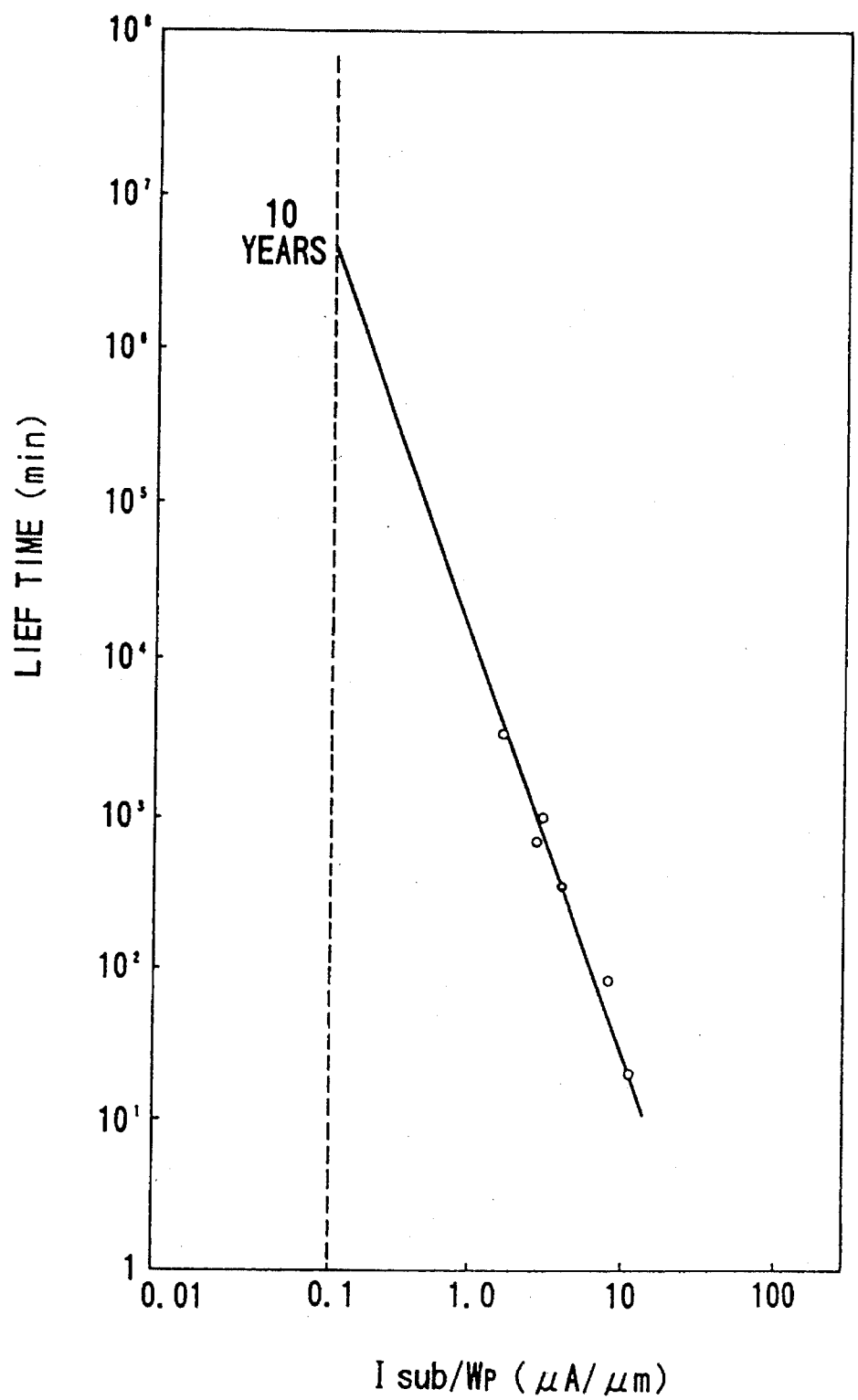
FIG. 15 is a graph showing the reliability life time characteristics of a device when the present invention is applied.

FIG. 15 shows the reliability life time characteristics of a device obtained when the present invention is applied, in which device SOG is formed on an ozone TEOS-SiO$_2$ film. In this graph, the substrate current (Isub) is plotted on the abscissa, and the gm life time is plotted on the ordinate. It is apparent from this graph that the life time was improved when the power supply was 3.3 V. The life time was improved because the lowermost dielectrics film blocked water and at the same time water from the ozone TEOS-SiO$_2$ film and the SOG was desorbed during formation of the uppermost dielectrics film, thereby reducing the water content in the films. The present invention has a characteristic that it can provide an interlevel dielectrics film configuration required for a multilevel interconnection and can ensure a high reliability of a device.

Embodiment 4

Figure 16:
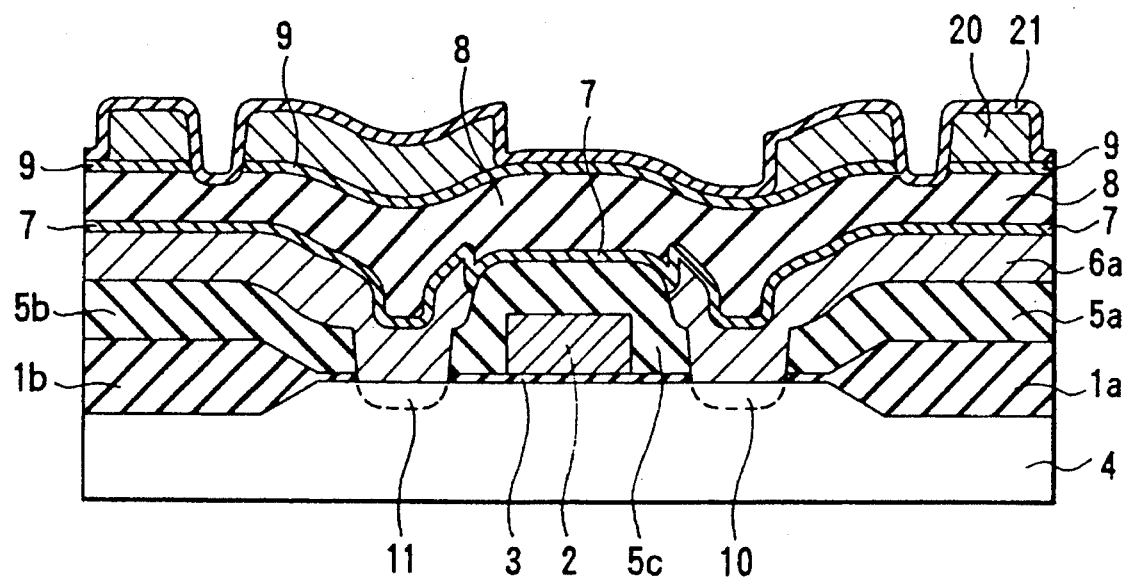
FIG. 16 is a cross-sectional view showing the structure of a modification of the present invention.

FIG. 16 shows a modification of the structure in FIG. 2, in which a second metal interconnection 20 is formed on an uppermost dielectrics film 9 of a second interlevel film, and the lowermost dielectrics film of a third interlevel film is formed on the layer 20. In this structure, as in the structure shown in FIG. 2, source and drain regions 10 and 11 were formed on a semiconductor substrate 4, and a gate oxide film 3 and a gate electrode 2 were formed on a portion of the substrate sandwiched between the source and drain regions; these elements constituted a MOS transistor. First metal interconnections 6a and 6b were formed on the source and drain regions through their respective contacts. A first (lowermost) dielectrics film 7, a second (intermediate) dielectrics film 8, and the third (uppermost) dielectrics film 9 of the second interlevel film were formed in sequence on the metal interconnections 6a and 6b and on a dielectrics film 5c formed around the gate electrode. In this configuration, the first interlevel dielectrics 5 consisted of a CVD-SiO$_2$ film and was annealed at 850° C. The metal interconnections 6a and 6b were formed after holes were formed in portions of the interlevel film 5 corresponding to the source and drain of the MOS transistor. As these metal interconnections, AlSiCu was formed to have a thickness of 5,000 Å and patterned in accordance with a predetermined interconnection pattern. The lowermost, intermediate, and uppermost dielectrics films 7, 8, and 9 of the second interlevel film arranged on these interconnections were formed as follows. First, an SiO$_2$ film having 3,000 Å in thickness was formed as the lowermost layer by ECR plasma CVD, and an ozone TEOS-SiO$_2$ film was formed to have a thickness of 1,000 Å to 3,000 Å. Subsequently, SOG to be combined with this ozone TEOS-SiO$_2$ film to serve as the intermediate dielectrics film 8 was coated once and annealed in a nitrogen atmosphere at 400° C. for 30 minutes. Thereafter, an SiO$_2$ film was deposited to have a thickness of 1,000 Å as the uppermost dielectrics film by the ECR plasma CVD.

Holes (through holes) for connecting the first metal interconnections with the second metal interconnection 20 formed on them were formed in desired positions of the interlevel dielectrics 7, 8, and 9 on the first metal interconnections. Various treatments were performed as annealing after the formation of the through holes, and the second metal interconnection 20 was deposited and formed into a predetermined interconnection pattern. In addition, a plasma CVD film 21 for surface protection was formed on the interconnection 20. In this case, the various treatments included: ① annealing in a nearly vacuum atmosphere (with 100 cc of a nitrogen flow and a vacuum degree of 0.01 Torr or less) at 400° C. for 30 minutes; ② annealing in a low-pressure (⅓ atm) nitrogen atmosphere at 400° C. for 30 minutes; ③ annealing in a low-pressure (⅓ arm) hydrogen atmosphere at 400° C. for 30 minutes; ④ annealing in an atmospheric-pressure nitrogen atmosphere at 400° C. for 30 minutes; and ⑤ no annealing. The above treatments in the vacuum, hydrogen, nitrogen atmospheres were performed for 30 minutes after the temperature was stabilized.

Figure 17:
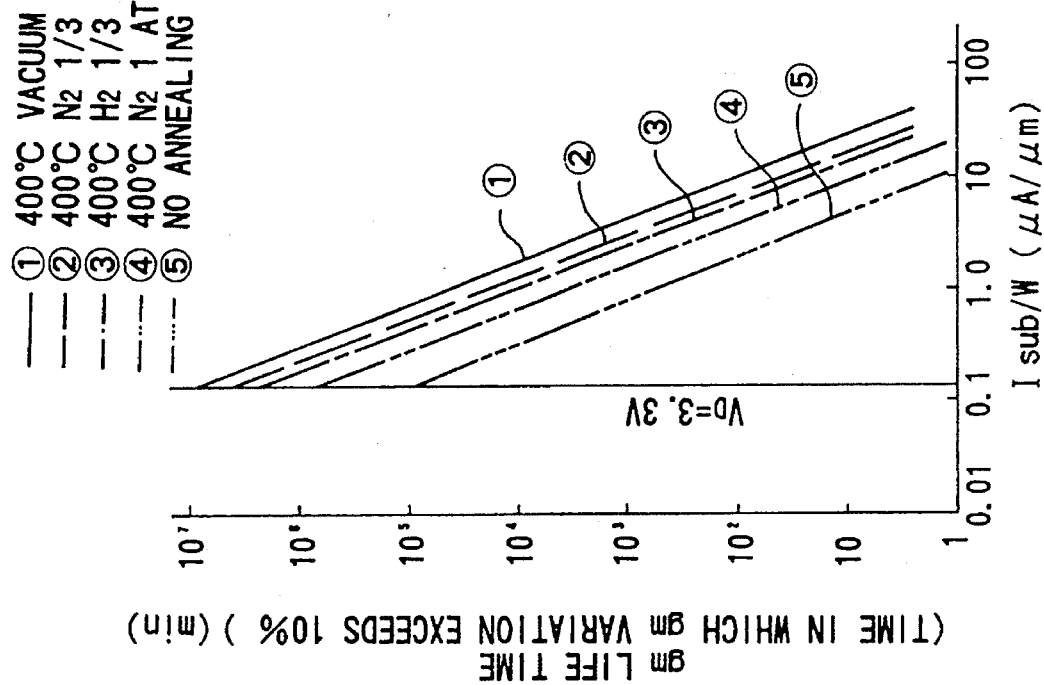

FIG. 17 shows the degradation characteristics of fine MOS transistor devices with a channel length of 0.5 μm formed by processes including the above treatments. In this graph, the substrate current (Isub) is plotted on the abscissa, and the gm life time is plotted on the ordinate. FIG. 17 shows the variation life time of a transconductance gm as representative characteristics of a MOS transistor. A threshold voltage as another representative device characteristics of the MOS transistor also exhibit a similar change but has a slightly longer life time in device characteristics. For example, the life time of the transconductance gm at a gate voltage of 3.3 V is prolonged about 100 times (about 9×10$^6$ minutes) that obtained under the conventional condition of ⑤ no annealing, by performing ① annealing in a vacuum at 400° C. for 30 minutes. Although this effect is slightly decreased under the condition of ② annealing in a low-pressure (⅓ arm) nitrogen atmosphere, the gm life time is prolonged about 45 times (about 4×10$^6$ minutes). Under the condition of ③ annealing in a low-pressure (⅓ atm) hydrogen atmosphere, the gm life time is prolonged about 25 times (about 2.5×10$^6$ minutes) even though the effect is smaller than that obtained by nitrogen. When ④ annealing in an atmospheric-pressure nitrogen atmosphere is performed, the gm life time is prolonged about seven times (7×10$^5$ minutes).

This phenomenon demonstrates that water contained in the ozone TEOS-SiO$_2$ film and the SOG film was desorbed through the uppermost plasma CVD film upon annealing. The effect decreased in an order of ① , ②, ③, and ④ because the partial pressure (the pressure of water or vapor alone) of water in the atmosphere on the surface upon annealing changed. That is, under the condition of ① annealing in a vacuum, exhaustion was performed at a maximum exhaust rate by a vacuum pump, so water on the substrate surface was exhausted immediately after desorbed from the substrate. Under the condition of ② annealing in a low-pressure (⅓ atm) nitrogen atmosphere, on the other hand, the exhaust rate was decreased to maintain the pressure at ⅓ atm. Therefore, the flow rate of nitrogen gas on the substrate surface was low, and desorbed water more or less stayed on the surface. For this reason, desorption of water from the substrate surface was determined by equilibrium between the atmosphere and the water, and this decreased the desorption rate of water from the surface. In fact, when annealing was performed in the same vacuum atmosphere as the condition ① but at the same exhaust rate as the ⅓-atm nitrogen annealing by decreasing the flow rate of nitrogen gas to almost zero, nearly the same improving effect as the condition ② was obtained. This is so because the exhaust rates were almost the same. In the annealing in an atmospheric-pressure nitrogen atmosphere, since the gas flow rate on the substrate surface was lower than that in a low-pressure atmosphere, the water desorption rate was also lower. The effect of the hydrogen atmosphere was smaller than that of the nitrogen atmosphere at the same pressure because the water concentration that nitrogen gas itself possesses is lower than that of hydrogen gas. The water concentration of nitrogen used in the above experiments was 10 ppb.

As is apparent from the above results, the annealing in a nitrogen atmosphere performed after the formation of through holes has an effect of prolonging the variation life time of device characteristics of a MOS transistor. It is obvious that the same effect can be obtained even when this annealing process is performed not after the formation of through holes but after the interlevel film formation process. In addition, the annealing in a low-pressure atmosphere remarkably enhances the effect of prolonging the variation life time of device characteristics of a MOS transistor, and the effect is further enhanced in a vacuum atmosphere. Note that it is necessary to sufficiently exhaust water desorbed from the surface of a wafer. That is, a more startling effect can be obtained by decreasing the water pressure in an atmosphere on the wafer surface as low as possible during annealing.

Embodiment 5

It was confirmed that when the annealing of the present invention described above in Embodiment 4 was performed not after the formation of through holes but after the formation of the second metal interconnection pattern 20 after the through hole formation, it was possible to obtain an effect better than that obtained by the annealing after the through hole formation.

The most significant effect can be obtained when, of course, the annealing is performed after both the formation of through holes and the formation of the second metal interconnection pattern 20.

In addition, when a plasma CVD film formed using TEOS and oxygen as reaction gases is used as the uppermost plasma CVD film, the diffusion rate of water is increased. Hence, water contained in the ozone TEOS-SiO$_2$ film and the SOG film is desorbed more easily through the uppermost layer upon annealing after the formation of the interlevel films. This decreases an amount of water diffusing toward the substrate to suppress degradation caused by hot carriers.

Embodiment 6

In the above Embodiments 4 and 5, annealing is performed before or after the formation of the second interconnection. However, when a larger number of interconnections, e.g., three or four interconnections are to be formed, it is more preferable to perform the annealing process described in the above embodiments each time the interconnection is formed.

Embodiment 7

As the second interlevel dielectrics in the structure shown in FIG. 2, an ECR plasma CVD-SiO$_2$ film 7, an ozone TEOS-SiO$_2$ film, and an SOG 8 as a coating film were annealed in a nitrogen atmosphere at 400° C., and an SiO$_2$ film 9 was deposited to have a thickness of 2,000 Å as an uppermost dielectrics film by TEOS plasma CVD in which film deposition was performed at a temperature of 400° C. For comparison, a sample was also manufactured in which a 2,000-Å thick film was formed as the uppermost film by ECR plasma CVD which deposited at room temperature.

Holes (through holes) for connecting a first metal interconnection with a second metal interconnection to be formed on the first metal interconnection were formed in predetermined positions of the above interlevel dielectrics on the first metal interconnection. After the second metal was deposited, an interconnection pattern was formed. In addition, as a passivation film, an ECR plasma CVD film was deposited to have a thickness of 5,000 Å and annealed in a hydrogen atmosphere at 400° C. for 30 minutes. Thereafter, the characteristics of the resulting MOS transistor were measured.

Figure 18:
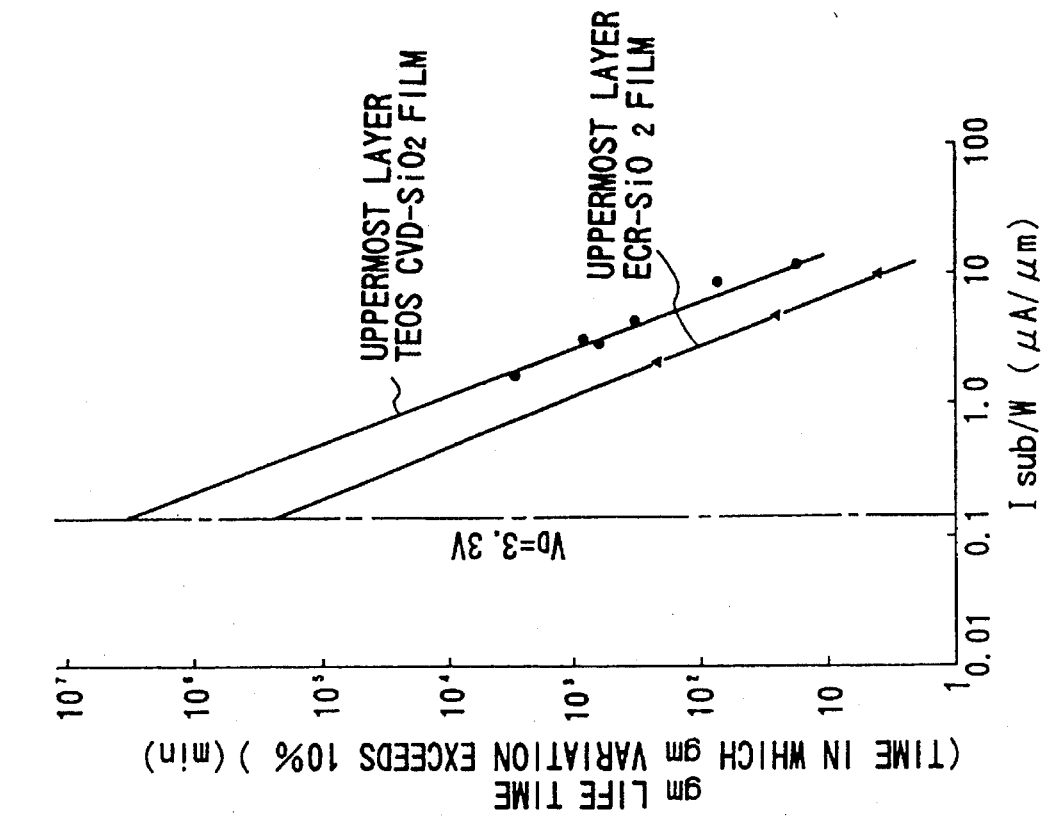
FIGS. 17 and 18 are graphs showing the device degradation characteristics when various treatments are performed for interlevel films.
Figure 19:
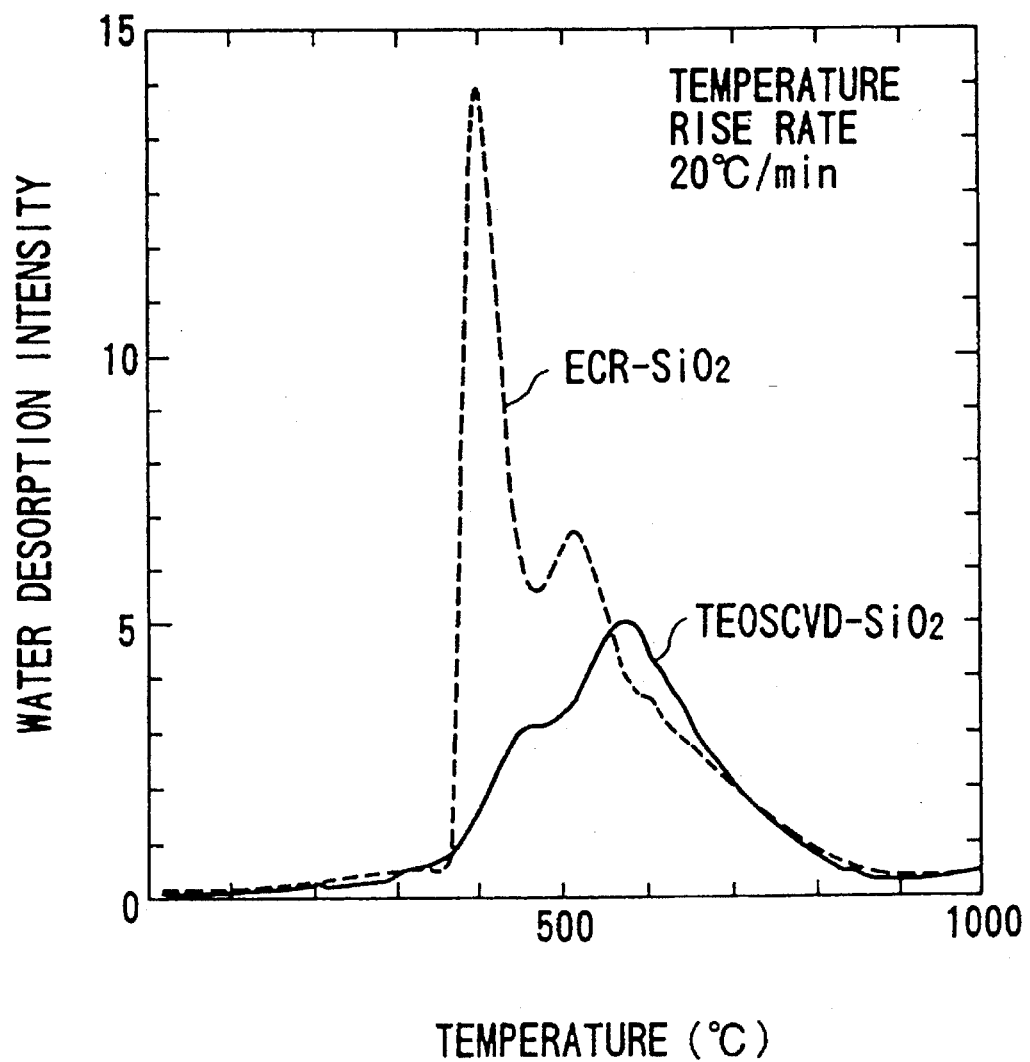
FIGS. 19, 20, and 21 are graphs showing the measurement results of water content thermal desorption spectra.

FIG. 18 shows the degradation characteristics of the MOS transistor with a channel length of 0.5 μm formed by the above process. In this graph, the substrate current (Isub) is plotted on the abscissa, and the gm life time is plotted on the ordinate. FIG. 18 illustrates the variation life time of a transconductance gm as representative characteristics of a MOS transistor. A threshold voltage as another representative device characteristics of the MOS transistor also exhibit a similar change but has a slightly longer life time in device characteristics. As shown in FIG. 18, the life time of gm obtained by using the TEOS plasma CVD-SiO$_2$ film as the uppermost layer of the interlevel film is about ten times longer than that obtained by using the ECR plasma CVD-SiO$_2$ film. This results from the difference in film formation conditions between the TEOS plasma CVD-SiO$_2$ film and the ECR plasma CVD-SiO$_2$ film; film is deposited at nearly room temperature in the ECR plasma CVD, whereas it is started after a substrate is left to stand in a vacuum at a temperature of 400° C. for a few seconds to a few tens of seconds in the TEOS plasma CVD. This means that in the TEOS plasma CVD, annealing is performed in a vacuum at a temperature of 400° C.; water is desorbed from SOG and the ozone TEOS-SiO$_2$ film during this annealing, and the TEOS plasma SiO$_2$ film is formed after that. In addition, the substrate is kept at a temperature of 400° C. during the film formation, so water is desorbed through the formed thin film. Therefore, water in the SOG and the ozone TEOS CVD film is desorbed by these two effects. An ECR plasma CVD-SiO$_2$ film and a TEOS plasma CVD-SiO$_2$ film were actually formed on SOG films formed under the same conditions, and water thermal desorption spectra (TDS) of these structures were measured. FIG. 19 is a graph showing the measurement results. Since the water content in the ECR plasma CVD film or the TEOS plasma CVD film is very small compared to that in the SOG film, it can be considered that water is desorbed mostly from the underlying SOG film. As is apparent from FIG. 19, the total amount of desorbed water from the TEOS plasma CVD film is much smaller than that from the ECR film. In particular, an amount of water desorbed near 400° C. is very small. The reason for this can be considered that since the film formation temperature of the TEOS plasma CVD is 400° C., water desorbed at temperatures of about 400° C. or less is removed effectively in the TEOS plasma CVD, and there is no large difference in amount of water desorbed at higher temperatures between the two processes. (It should be noted that the temperature is raised at a predetermined rate of 20° C./min. in the TDS measurement, so the results are independent of the effect of annealing time. In practice, since the annealing is performed for 30 minutes, water desorbed at temperatures higher than 400° C. found in the TDS measurement is also removed). The temperature does not largely exceed 400° C. so often in a normal interconnection formation process. Therefore, water desorbed at 400° C. or more is unlikely to diffuse during the process to reach the gate oxide film of a MOS transistor, thereby eliminating adverse influences on the structure. That is, water desorbed at temperatures near 400° C. or less has a large influence, and FIG. 19 reveals that a considerable amount of water with this large influence is desorbed during the formation of the TEOS plasma CVD film. In the graph of FIG. 19, the temperature is plotted on the abscissa, and the water desorption intensity is plotted on the ordinate. This is the reason why the life time of the transconductance gm of the structure using the TEOS plasma CVD-SiO$_2$ film is larger than that of the structure using the ECR plasma CVD-SiO$_2$ film, as shown in FIG. 18. In this embodiment, the description has been made by taking only the TEOS plasma CVD film as an example. However, the same effect can be obtained by forming a film by plasma CVD using silane gas and N$_2$O gas as reaction gases, which is performed at the same film formation temperature of about 400° C.

Figure 21:
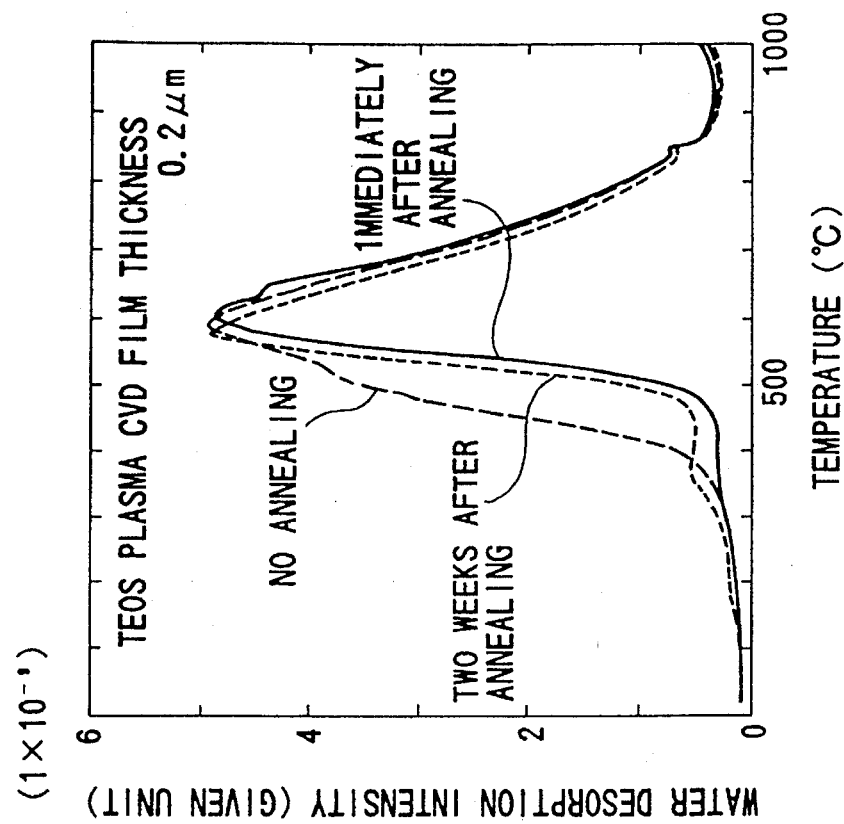
Figure 20:
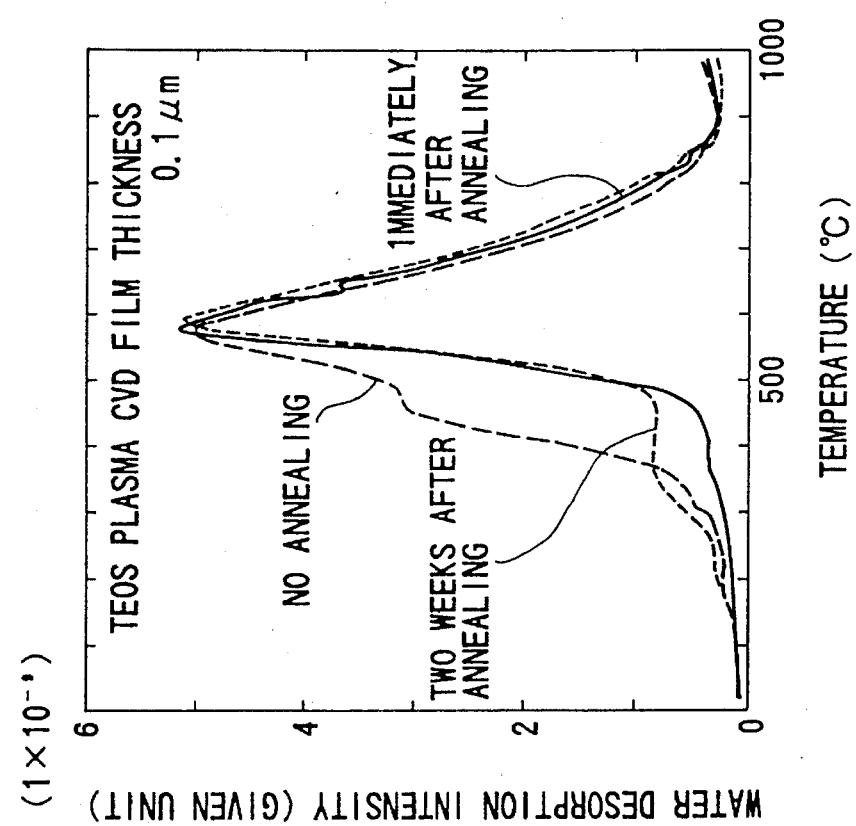

It should also be noted that the above effect becomes useless if the uppermost TEOS plasma CVD film absorbs water from the atmosphere after the film formation. FIGS. 20 and 21 show the results of examination of this possibility. In each graph, the temperature is plotted on the abscissa, and the water desorption intensity is plotted on the ordinate. FIGS. 20 and 21 illustrate the measurement results of thermal desorption spectra of samples formed by depositing 1,000-Å and 2,000-Å thick TEOS plasma CVD films on SOG films, respectively. Each graph also shows data of TDS of a sample annealed in a nitrogen atmosphere at 400° C. for 30 minutes after the film formation; one TDS measurement result was obtained by placing the sample in a vacuum atmosphere for TDS measurement within one hour after the annealing, and the other TDS measurement result was obtained after the same sample was left to stand in the air for two weeks. From comparison between the data obtained after the annealing, the water desorption intensity near 300° C. to 500° C. is slightly high in the sample left to stand for two weeks. However, it can be considered that the amount is not so large when this long period of two weeks is taken into account. In the sample having the uppermost TEOS plasma CVD film with a thickness of 2,000 Å, an increase in water content is very small. Hence, when the film thickness is 1,000 Å or more, reabsorption of water is not a problem insofar as the TEOS plasma CVD-SiO$_2$ film is concerned.

In situations where this very small increase in water is of a problem, a thin ECR plasma CVD-SiO$_2$ film or a thin silicon nitride film need only be formed on this TEOS plasma CVD-SiO$_2$ film.

The effect of removing water by desorption by increasing the substrate temperature up to about 400° C. during the formation of the above uppermost film is obtained because an ECR plasma CVD film having a low water permeability is formed to have a thickness of 3,000 Å below the SOG film and the ozone TEOS-CVD film. If such an underlying film is not formed or an underlying film with a high water permeability is formed, water diffuses into the MOS device region through the underlying film during heating of the substrate in formation of the uppermost film, causing degradation in characteristics. Therefore, it is necessary to use the ECR plasma CVD film or the like having a high ability to prevent water penetration. A film having this function may be a silicon nitride film (formable by plasma CVD or thermal decomposition CVD).

In this embodiment, 400° C. is exemplified as the substrate heating temperature in the formation of the uppermost film of the interlevel film. However, the higher the temperature, the better the resulting effect. In an actual process, the temperature is about 300° C. to 500° C.

Embodiment 8

The effect of the above Embodiment 7 cannot necessarily be obtained unless the substrate is heated to about 400° C. during film formation. The same effect can be obtained by performing annealing at a high temperature before a film is formed on an SOG film and an ozone TEOS-CVD-$SiO_2$ film and then forming a film on it in a condition in which no water is absorbed by the structure. That is, the SOG film and the ozone TEOS-CVD film absorb water in a few minutes when exposed to the air. Therefore, film formation need only be performed by transferring the substrate from an annealing system to a plasma CVD system through a vacuum atmosphere or a nitrogen or argon atmosphere containing little water. In this case, as already described above in the Embodiment 7, the plasma CVD film formed must be a film which does not absorb water in the atmosphere or in an aqueous solution in the subsequent processes after the film formation. A TEOS plasma CVD-$SiO_2$ film or an ECR plasma CVD-$SiO_2$ film as described above is satisfactory for this purpose. Since the ECR plasma CVD film allows almost no penetration of water when left to stand at room temperature, this film is stronger than the TEOS plasma CVD films shown in FIGS. 20 and 21 against being left to stand after the annealing.

Embodiment 9

In order to further enhance the effect of removing water by desorption of the above Embodiments 7 and 8, a process of performing annealing at a temperature of about 400° C. may be introduced after formation of an interlevel film. As is apparent from FIGS. 20 and 21, even when film formation is performed at 400° C., if annealing is performed at 400° C. for 30 minutes after that, an amount of water desorbed at a temperature of about 400° C. to 500° C. is greatly reduced. This indicates that water was again desorbed through a TEOS plasma CVD film by the annealing at 400° C. for 30 minutes; the effect of the annealing is significant. It should be noted, however, that the annealing also encourages diffusion of water into the underlying MOS device region. Therefore, in order to effectively desorb water during the annealing process, it is required that a film having a high ability to prevent penetration of water, such as an ECR plasma CVD film or a silicon nitride film (formable by plasma CVD or thermal decomposition CVD), be formed below the SOG and the ozone TEOS-CVD film of an interlevel film. It is also necessary that the film to be formed on that film must have a higher water permeability than that of the underlying film. In this case, this uppermost film must have an ability to prevent penetration of water at temperatures near room temperature. In addition, the film thickness of the uppermost film is preferably as small as possible provided that the film does not lose its water penetration preventing function at about room temperature. The water permeability of the uppermost film of the interlevel film need not be higher than that of the underlying film over the full temperature range but need only be higher than that over the range of 300° C. to 500° C. centered on 400° C. as the highest temperature in the interconnection process. Examples of such a film are a TEOS plasma CVD film when the underlying film is an ECR plasma CVD film, and a TEOS plasma CVD film, an ECR plasma CVD film, or a silane-based plasma CVD film when the underlying film is a silicon nitride film.

The annealing process need only be performed after the uppermost film of the second interlevel film is formed and before the film having a low water permeability is formed on that film. In a regular MOSLSI interconnection process, therefore, the annealing is performed immediately after formation of the second interlevel film, after through holes are formed in the second interlevel film in order to connect the second interlevel film with the upper second metal interconnection, or after formation of the second metal interconnection pattern after that.

It is also possible to obtain the water removing effect by desorbing water from the interlevel films during the annealing process without performing the water removing process shown in Embodiments 7 and 8.

In addition, as the annealing temperature is increased, the water diffusion rate is also increased, and a better effect results in.

Embodiment 10

Figure 22:
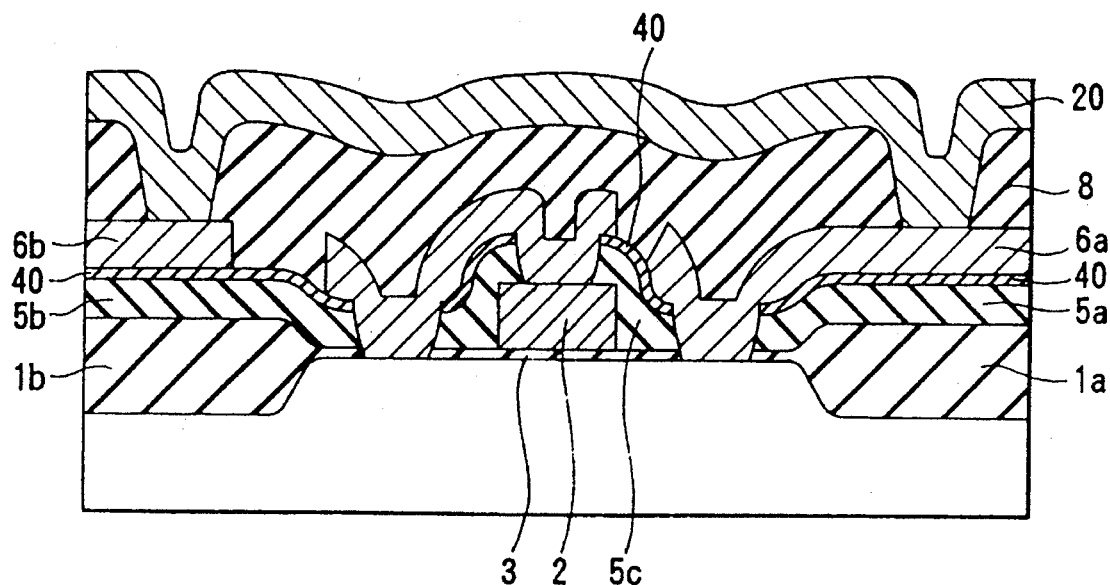
FIGS. 22 and 23 are sectional views showing the structures of modifications of the present invention.
Figure 23:
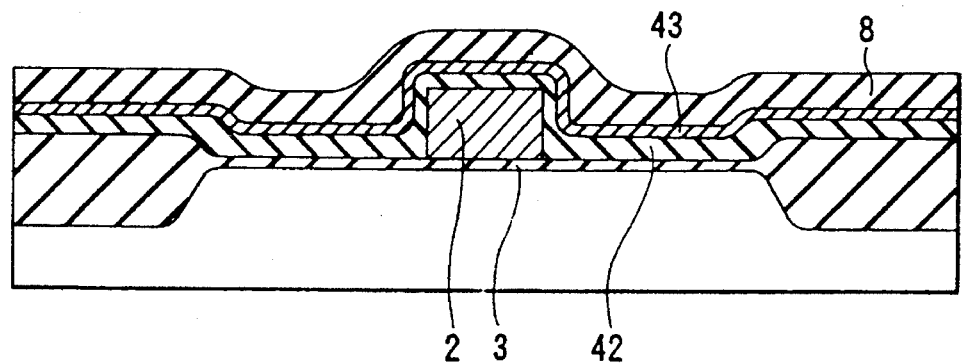

In a semiconductor integrated circuit including a MOS transistor, as shown in FIG. 22, phosphorus-doped polysilicon as a gate electrode 2 was formed on a gate oxide film 3, CVD-$SiO_2$ films 5a, 5b, and 5c containing an oxide of boron (B) or phosphorus (P) were formed as a first interlevel film, and annealing was performed at 800° C. to 1,000° C. One important role of this oxide film is to decrease, by formation of the smooth surface interlevel film, a step height produced by formation of the underlying gate electrode and the like. In particular, a silicon oxide film containing B or P acquires flowability upon annealing at 800° C. to 1,000° C. to yield a smooth film. Another important role is derived from the ability of the oxide of B or P contained in this film to trap and inactivate mobile ions, such as Na, having a very bad effect on characteristics of a MOS transistor. The use of the film having this effect as the first interlevel films 5a, 5b, and 5c not only prevents penetration of mobile ions, such as Na, from the upper layer but also absorbs mobile ions, such as Na, which have penetrated into the MOS device region below this film during the device formation process, thereby protecting the device against contamination by mobile ions. In addition, as shown in FIG. 23, a film 40 having a high ability to prevent water penetration, such as an ECR plasma CVD film using electron cyclotron resonance or a silicon oxide film (formable by plasma CVD or thermal decomposition CVD), is deposited on the first interlevel film. Therefore, when first metal interconnection patterns 6a and 6b are formed on the film 40 and a film consisting of, e.g., an SOG film and an ozone TEOS-CVD film is formed as a second interlevel dielectrics 8, the above film 40 can prevent penetration of water from the dielectrics film 8 into the underlying device. Note that reference numeral 20 denotes a second metal interconnection connected with the first metal interconnection 6a via through holes as in the structure shown in FIG. 16.

As a simple arrangement for preventing degradation with time of a MOS transistor caused by hot carriers, it is possible to form a film having a high ability to prevent water penetration, such as the silicon nitride films 5a, 5b, and 5c, immediately above the MOS transistor, form a CVD-$SiO_2$ film containing at least one of oxides of boron (B) and phosphorus (P) on that film, and perform annealing at 800° C. to 1,000° C. However, when the silicon nitride films 5a, 5b, and 5c are formed immediately above the MOS transistor, diffusion of mobile ions, such as Na, which have penetrated during the process of forming the underlying device is also suppressed; this is unpreferable in terms of protection of the device against mobile ions. Therefore, it is preferable to form the film 40 having a low water permeability, such as a silicon nitride film, after formation of the CVD-SiO$_2$ film containing an oxide of B or P, as the interlevel film.

Embodiment 11

In the above Embodiment 10, after formation of the CVD-SiO$_2$ film containing at least one of oxides of boron (B) and phosphorus (P) as the first interlevel film, the film having a high ability to prevent penetration of water, such as a silicon nitride film, is formed, and then the first metal interconnection is formed on it. However, the configuration is not necessarily this one. That is, a CVD-SiO$_2$ film containing at least one of oxides of B and P need only be formed below the silicon oxide film or the like. Therefore, as shown in FIG. 23, after a film 43 capable of preventing water penetration, such as a silicon nitride film, is formed on a CVD-SiO$_2$ film 42 containing at least one of oxides of B and P, a CVD-SiO$_2$ film 8 containing at least one of oxides of B and P may be formed. Although annealing at 800° C. to 1,000° C. may be performed after formation of each CVD-SO$_2$ film, it need only be performed after formation of the second film 8. In this configuration, the function of trapping mobile ions, such as Na, which have penetrated during the device formation process is assigned to the lower film, and the function of obtaining an underlying planarizing structure for forming a metal interconnection on it and the function of trapping mobile ions from the upper portion are assigned to the upper film.

In addition, when a silicon nitride film having a very high ability to prevent water penetration is used in the structure, a high flowability can be obtained at a low annealing temperature of 750° C. to 900° C. if annealing is performed in an atmosphere containing a large quantity of water vapor after the formation of the upper CVD-SiO$_2$ film containing at least one of oxides of B and P. The result is a smooth, planarized surface profile. The low-temperature annealing is advantageous as a process of forming a miniaturized device in that diffusion of doped impurities can be suppressed. If this annealing in a water vapor atmosphere is performed without the intermediate silicon nitride film, water diffuses to the device region to induce oxidation of the substrate or the gate polysilicon, thereby adversely affecting the device. With the use of the intermediate silicon nitride film, the influence on the underlying device is reduced and a smooth surface profile can be obtained because of a low annealing temperature. The film thickness of the silicon nitride film need only be 100 Å. Although it depends on the film formation method, a film thickness of 50 Å cannot satisfactorily prevent water penetration.

As has been described above in detail, the present invention can achieve the effects summarized below.

① According to the characteristics features of the present invention, a dielectrics film capable of preventing penetration of water, such as an SiO$_2$ film formable by ECR plasma CVD or a silicon nitride film, is formed below a metal interconnection. Therefore, even when a dielectrics film containing a large amount of water is formed as a metal interconnection interlevel film on the metal interconnection by spin on glass or ozone TEOS-CVD, water diffusion toward the underlying layer can be suppressed. As a result, it is possible to form an interlevel film which does not degrade a device.

② According to the characteristics features of the present invention, as an interlevel film between metal interconnections, a dielectrics film capable of preventing penetration of water, such as an SiO$_2$ film formable by ECR plasma CVD or a silicon nitride film, is formed below a dielectrics film formed by spin on glass or ozone TEOS-CVD. An upper plasma CVD film is formed while water is desorbed, or immediately after desorption of water, in a condition that reabsorption of water is prevented, or water is desorbed away effectively by performing annealing after the formation of the interlevel film, thereby decreasing the water content in the interlevel dielectrics. Therefore, it is possible to form an interlevel film which does not cause degradation in a device.

③ According to the characteristics features of the present invention, a dielectrics film containing dangling bonds and Si-H is formed below at least a dielectrics film formed by spin on glass or ozone TEOS-CVD, thereby blocking water from the dielectrics film. In addition, another dielectrics film is formed on the above dielectrics film, formed by the spin on glass or the ozone TEOS-CVD, by using a dielectrics film formation system while a substrate is heated. As a result, there is provided an interlevel film without giving any hot carrier degradation to a device.

What is claimed is:

1. A method of fabricating a semiconductor device, comprising the steps of:

forming a first dielectrics film capable of suppressing penetration of water on a semiconductor substrate;

forming a second dielectrics film by spin on glass or chemical vapor deposition;

heating said semiconductor substrate to desorb all or part of water from said second dielectrics film; and forming a third dielectrics film in an atmosphere substantially free of water, thereby forming an interlevel film constituted by said dielectrics films.

2. A method of fabricating a semiconductor device, comprising the steps of:

forming a semiconductor device and a first metal interconnection on a semiconductor substrate;

forming a first dielectric film containing dangling bonds and a bonded group of Si and hydrogen;

forming a second dielectric film on said first dielectric film;

forming a third dielectric film having different characteristics from said second dielectric film on said second dielectric film, thereby forming an interlevel film constituted by said dielectric films.

3. A method according to claim 2, wherein said third dielectrics film is formed while water is desorbed from said second dielectrics film.

4. A method according to claim 1, wherein said first dielectrics film is formed by ECR plasma CVD.

5. A method according to claim 4, wherein said first dielectrics film is a silicon oxide film.

6. A method according to claim 1, wherein said first dielectrics film is a nitride film.

7. A method of fabricating a semiconductor device, comprising the steps of:

forming a semiconductor device and a first metal interconnection on a semiconductor substrate;

forming a first dielectrics film capable of preventing penetration of water;

forming a second dielectrics film on said first dielectrics film;

forming a third dielectrics film having different characteristics from those of said second dielectrics film;

forming holes reaching said first metal interconnection; and forming a second metal interconnection.

8. A method according to claim 7, wherein annealing is performed after formation of said holes reaching said first metal interconnection.

9. A method according to claim 7, wherein said first dielectrics film is formed by ECR plasma CVD.

10. A method according to claim 9, wherein said first dielectrics film is a silicon oxide film.

11. A method according to claim 7, wherein said first dielectrics film is a nitride film.

12. A method of fabricating a semiconductor device, comprising the steps of:

forming a semiconductor device and a first metal interconnection on a semiconductor substrate;

forming a first dielectrics film capable of suppressing penetration of water;

forming a second dielectrics film on said first dielectrics film;

forming a third dielectrics film having different characteristics from those of said second dielectrics film;

forming a second metal interconnection on said third dielectrics film; and forming holes reaching said first metal interconnection, thereby connecting said first and second metal interconnections.

13. A method according to claim 12, wherein said first dielectrics film is formed by ECR plasma CVD.

14. A method according to claim 13, wherein said first dielectrics film is a silicon oxide film.

15. A method according to claim 12, wherein said first dielectrics film is a nitride film.

\* \* \* \* \*